(12) United States Patent
Na et al.

(10) Patent No.: US 12,015,384 B2
(45) Date of Patent: Jun. 18, 2024

(54) PHOTO-CURRENT AMPLIFICATION APPARATUS

(71) Applicant: Artilux, Inc., Menlo Park, CA (US)

(72) Inventors: Yun-Chung Na, Hsinchu County (TW); Yen-Cheng Lu, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 754 days.

(21) Appl. No.: 16/997,951

(22) Filed: Aug. 20, 2020

(65) Prior Publication Data

US 2021/0058042 A1 Feb. 25, 2021

Related U.S. Application Data

(60) Provisional application No. 62/993,651, filed on Mar. 23, 2020, provisional application No. 62/890,076, filed on Aug. 22, 2019.

(51) Int. Cl.
*H03F 3/08* (2006.01)
*G01J 1/44* (2006.01)
(Continued)

(52) U.S. Cl.
CPC ............... *H03F 3/085* (2013.01); *G01J 1/44* (2013.01); *H01L 31/107* (2013.01);
(Continued)

(58) Field of Classification Search
None
See application file for complete search history.

(56) References Cited

U.S. PATENT DOCUMENTS 7,348,608 B2 3/2008 Ko et al.
7,629,661 B2 12/2009 Rafferty et al.
(Continued)

FOREIGN PATENT DOCUMENTS

CN 104247046 12/2014
CN 104794294 7/2015
(Continued)

OTHER PUBLICATIONS

Bamji et al., "A 0.13 μm CMOS System-on-Chip for a 512 x 424 Time-of-Flight Image Sensor With Multi-Frequency Photo-Demodulation up to 130 MHz and 2 GS/s ADC," IEEE J. Solid-State Circuits, Jan. 2015, 50(1):303-319.
(Continued)

*Primary Examiner* — Nilufa Rahim
(74) *Attorney, Agent, or Firm* — Fish & Richardson P.C.

(57) ABSTRACT

A photo-current amplification apparatus is provided. The photo-current amplification apparatus includes a photo-detecting device including: a substrate; an absorption region comprising germanium, the absorption region supported by the substrate and configured to receive an optical signal and to generate a first electrical signal based on the optical signal; an emitter contact region of a conductivity type; and a collector contact region of the conductivity type, wherein at least one of the emitter contact region or the collector contact region is formed outside the absorption region, and wherein a second electrical signal collected by the collector contact region is greater than the first electrical signal generated by the absorption region.

12 Claims, 22 Drawing Sheets

(51) Int. Cl.
*H01L 31/107* (2006.01)
*H01L 31/18* (2006.01)
(52) U.S. Cl.
CPC ......... *H01L 31/1808* (2013.01); *H03F 3/087* (2013.01); *G01J 2001/4466* (2013.01)

(56) References Cited

U.S. PATENT DOCUMENTS

| | | |
|---|---|---|
| 7,741,657 B2 | 6/2010 | Pauchard et al. |
| 7,884,310 B2 | 2/2011 | Buettgen |
| 8,275,270 B2 | 9/2012 | Shushakov et al. |
| 8,405,823 B2 | 3/2013 | Pfaff |
| 8,704,272 B2 | 4/2014 | Huang et al. |
| 9,748,429 B1 | 8/2017 | Davids et al. |
| 9,755,096 B2 | 9/2017 | Novack et al. |
| 10,103,285 B1 | 10/2018 | Lo |
| 10,854,770 B2 | 12/2020 | Na |
| 2002/0110950 A1* | 8/2002 | Matsuda ............. H01L 31/1105 438/70 |
| 2005/0230706 A1* | 10/2005 | Yagyu ................... H01L 31/107 257/481 |
| 2007/0152289 A1 | 7/2007 | Morse et al. |
| 2008/0017883 A1 | 1/2008 | Sarid et al. |
| 2008/0121866 A1 | 5/2008 | Yuan et al. |
| 2009/0315135 A1 | 12/2009 | Finkelstein et al. |
| 2011/0012221 A1 | 1/2011 | Fujikata et al. |
| 2011/0042553 A1* | 2/2011 | Masini .................. H01L 31/028 250/214 R |
| 2013/0062663 A1 | 3/2013 | Yuan et al. |
| 2014/0159129 A1 | 6/2014 | Wang |
| 2014/0252528 A1 | 9/2014 | Yasuoka et al. |
| 2014/0291481 A1 | 10/2014 | Zhang |
| 2014/0291682 A1 | 10/2014 | Huang et al. |
| 2015/0028443 A1 | 1/2015 | Shi et al. |
| 2015/0076647 A1* | 3/2015 | Tatum ................... H01L 31/107 257/438 |
| 2016/0155883 A1 | 6/2016 | Shi et al. |
| 2018/0026147 A1 | 1/2018 | Zhang |
| 2018/0190698 A1 | 7/2018 | Na et al. |
| 2018/0233528 A1* | 8/2018 | Na ........................ H04N 1/1931 |
| 2019/0165200 A1 | 5/2019 | Masini et al. |
| 2019/0341517 A1 | 11/2019 | Na |
| 2020/0028019 A1 | 1/2020 | Takimoto |
| 2020/0203547 A1 | 6/2020 | Benhammou et al. |
| 2020/0274019 A1* | 8/2020 | Zeng ................... H01L 31/1804 |
| 2021/0050470 A1 | 2/2021 | Na |
| 2022/0069153 A1 | 3/2022 | Li et al. |
| 2022/0109080 A1* | 4/2022 | Takemura ............. H01L 31/107 |
| 2023/0207719 A1* | 6/2023 | Chien ................. H01L 31/1075 257/186 |

FOREIGN PATENT DOCUMENTS

| | | |
|---|---|---|
| CN | 206541827 | 10/2017 |
| JP | 5523317 | 6/2014 |
| TW | 201743324 | 12/2017 |
| TW | 201810534 | 3/2018 |
| WO | WO 2007/000996 | 1/2007 |

OTHER PUBLICATIONS

Bianco et al., "A Comparative Analysis between Active and Passive Techniques for Underwater 3D Reconstruction of Close-Range Objects," Sensors, Aug. 20, 2013, 13(8):11007-11031.
Chen et al., "Self-Aligned Microbonded Germanium Metal-Semiconductor-Metal Photodetectors Butt-Coupled to Si Waveguides," IEEE J. Sel. Top. Quant. Electron., Nov. 2014, 20(6):3800605, 5 pages.
Dalla Betta et al., "Design and Characterization of Current-Assisted Photonic Demodulators in 0.18-μm CMOS Technology," IEEE Trans. Electron. Dev., Jun. 2011, 58(6):1702-1709.
Feng et al., "Vertical p-i-n germanium photodetector with high external responsivity integrated with large core Si waveguides," Optics Express, Jan. 4, 2010, 18(1):96-101.
Foix et al., "Lock-in Time-of-Flight (ToF) Cameras: A Survey," IEEE Sensors J., Sep. 2011, 11(9):1917-1926.
Geng, "Structured-light 3D surface imaging: a tutorial," Advances in Optics and Photonics, Jun. 30, 2011, 3(2):128-160.
Hutchinson et al., "High-Resolution Aliasing-Free Optical Beam Steering," Optica, Aug. 5, 2016, vol. 3, No. 8, 4 pages.
Joo et al., "High-sensitivity 10 Gbps Ge-on-Si photoreceiver operating at λ ~1.55 λm," Optics Express, Aug. 2, 2010, 18(16):16474-16479.
Kang et al., "Monolithic Ge/Si Avalanche Photodiodes," IEEE Xplore, 2009, 3 pages.
Kato et al., "320 x 240 Back-Illuminated 10-μm CAPD Pixels for High-Speed Modulation Time-of-Flight CMOS Image Sensor," IEEE J. Solid-State Circuits, Apr. 2018, 53(4):1071-1078.
Kawahito et al., "A CMOS Time-of-Flight Range Image Sensor With Gates-on-Field-Oxide Structure," IEEE Sensors J., Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron., Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon., Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Rafferty et al., "Monolithic germanium SWIR imaging array," 2008 IEEE Conference on Technologies for Homeland Security, Waltham, MA, May 12, 2008, p. 577-582.
Ramirez et al., "Recent progress on the quantum-dot avalanche photodiode," 22nd Annual Meeting of the IEEE Lasers and Electro-optics Society, Oct. 4, 2009, 2 pages.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Optics Express, Sep. 21, 2015, 23(19):24433-24439.
Tseng et al., "A self-assembled microbonded germanium/silicon heterojunction photodiode for 25 GB/s high-speed optical interconnects," Sci. Rep., Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017, 46(4B):2377-2380.
Van Nieuwenhove et al., "Photonic Demodulator With Sensitivity Control," IEEE Sensors J., Mar. 2007, 7(3):317-318.
Wang et al., "35GB/s Ultralow-Voltage Three-Terminal Si—Ge Avalanche Photodiode," 2019 Optical Fiber Communications Conference and Exhibition, Mar. 3, 2019, 3 pages.
Wu et al., "A critically coupled Germanium photodetector under vertical illumination," Opt, Express, Dec. 31, 2012, 20(28):29338-29346.
Yin et al., "31GHz Ge n-i-p waveguide photodetectors on Silicon-on-Insulator substrate," Optics Express, Oct. 17, 2007, 15(21):13965-13971.

(56) References Cited

OTHER PUBLICATIONS

Yokogawa et al., "IR sensitivity enhancement of CMOS Image Sensor with diffractive light trapping pixels," Sci. Rep., Jun. 19, 2017, 7(1):3832, 9 pages.

* cited by examiner

PHOTO-CURRENT AMPLIFICATION APPARATUS

CROSS REFERENCE TO RELATED APPLICATIONS

This application claims the benefit of U.S. Provisional Patent Application No. 62/890,076, filed Aug. 22, 2019, and U.S. Provisional Patent Application No. 62/993,651, filed Mar. 23, 2020, which are each incorporated by reference herein in its entirety.

BACKGROUND

Photodetectors may be used to detect optical signals and convert the optical signals to electrical signals that may be further processed by another circuitry. Photodetectors may be used in consumer electronics products, image sensors, high-speed optical receiver, data communications, direct/indirect time-of-flight (TOF) ranging or imaging sensors, medical devices, and many other suitable applications.

SUMMARY

The present disclosure relates generally to a photo-current amplification apparatus.

According to an embodiment of the present disclosure, a photo-current amplification apparatus is provided. The photo-current amplification apparatus includes a photo-detecting device including: a substrate; an absorption region including germanium, the absorption region supported by the substrate and configured to receive an optical signal and to generate a first electrical signal based on the optical signal; an emitter contact region of a conductivity type; and a collector contact region of the conductivity type, wherein at least one of the emitter contact region or the collector contact region is formed outside the absorption region, and wherein a second electrical signal collected by the collector contact region is greater than the first electrical signal generated by the absorption region.

According to an embodiment of the present disclosure, a method for operating a photo-detecting device capable of collecting electrons or holes is provided. The photo-detecting device includes applying a first voltage to a first electrode electrically coupled to an emitter contact region of the photo-detecting device to form a forward-bias between the emitter contact region and an absorption region of the photo-detecting device to form a first electron current; applying a second voltage to a second electrode electrically coupled to a collector contact region of the photo-detecting device to form a reverse-bias between the collector contact region and the absorption region to collect a portion of the first electron current, wherein the second voltage is higher than the first voltage; receiving an incident light in the absorption region to generate photo-carriers including electrons and holes; and amplifying a portion of the electrons of the photo-carriers to generate a second electron current; and collecting a portion of the second electron current by the collector contact region, wherein the second electron current is larger than the first electron current, and wherein at least one of the emitter contact region or the collector contact region is formed in a substrate of the photo-detecting device that has a different material from a material of the absorption region.

According to an embodiment of the present disclosure, a photo-current amplification apparatus is provided. The photo-current amplification apparatus includes a photo-detecting device including an absorption region including germanium; a first contact region of a first conductivity type; a second contact region of a conductivity type different from the conductivity type of the first contact region; a charge region of a conductivity type the same as the conductivity type of the first contact region, wherein a part of the charge region is between the first contact region and the second contact region; and a substrate supporting the absorption region, wherein a part of the absorption region is embedded in the substrate.

In some embodiments, the photo-detecting device further includes a first electrode electrically coupled to the first contact region, a second electrode electrically coupled to the second contact region and a third electrode electrically coupled to the charge region.

According to an embodiment of the present disclosure, a method for operating a photo-detecting device capable of collecting electrons or holes is provided. The photo-detecting device includes applying a first voltage to the first electrode, applying a second voltage to a second electrode and applying a third voltage to a third electrode to generate a first total current; and receiving an incident light in the absorption region to generate a second total current after the absorption region generates photo-carriers from the incident light; wherein the second total current is larger than the first total current and wherein the second voltage is greater than the first voltage.

In some embodiment, the third voltage is between the second voltage and the first voltage.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In general, a photo-current amplification apparatus with electron gain or hole gain can be implemented using fabrication processes that are CMOS compatible. In some embodiments, a photo-current amplification apparatus can be implemented by including absorption region on the substrate, for example, Ge-on-Si. In some embodiments, a photo-current amplification apparatus can be implemented by including absorption region embedded in the substrate, for example, Ge-in-Si.

The gain mechanism can be based on phototransistor effect or avalanche effect, in which the photo-carriers are multiplied and transported to the external circuits.

Figure 1A:
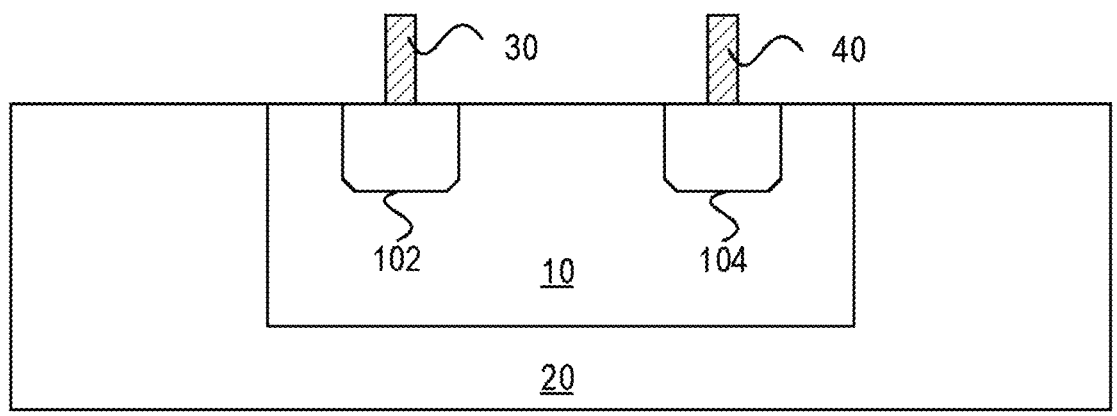
FIGS. 1A-1J illustrate cross-sectional views of a photo-detecting device, according to some embodiments.

FIG. 1A illustrates a cross-sectional view of a photo-detecting device, according to some embodiments. The photo-detecting device 100a includes an absorption region 10 and a substrate 20 supporting the absorption region 10. In some embodiments, the absorption region 10 is formed fully in/partially in/entirely on the substrate 20. The photo-detecting device 100a further includes an emitter contact region 102 and a collector contact region 104 in the absorption region 10. The collector contact region 104 is for collecting photo-carriers generated from the absorption region 10. The emitter contact region 102 is physically separated from the collector contact region 104. In some embodiments, the material of the emitter contact region 102 is the same as the material of the collector contact region 104. The emitter contact region 102 is of a conductivity type (e.g., p-type or n-type). The collector contact region 104 is of a conductivity type the same as the conductivity type of the emitter contact region 102. The photo-detecting device 100a includes a first electrode 30 electrically coupled to the emitter contact region 102 and includes a second electrode 40 electrically coupled to the collector contact region 104. The first electrode 30 serves as an emitter electrode. The second electrode 40 serves as a collector electrode. The absorption region 10 is of a conductivity type different from the conductivity type of the emitter contact region 102 and the collector contact region 104. In some embodiments, the conductivity type of the absorption region 10 is p-type, and the conductivity type of the emitter contact region 102 and the conductivity type of the collector contact region 104 are n-type. In some embodiments, the conductivity type of the absorption region 10 is n-type, and the conductivity type of the emitter contact region 102 and the conductivity type of the collector contact region 104 are p-type. In some embodiments, the absorption region 10 composed of intrinsic germanium is of p-type due to material defects formed during formation of the absorption region, where the defect density is from $1\times10^{14}$ cm$^{-3}$ to $1\times10^{16}$ cm$^{-3}$. In some embodiments, the term "intrinsic" means that the absorption region 10 is without intentionally added dopants. In some embodiments, the absorption region 10 is capable of absorbing an incident light and to generate photo-carriers after absorbing the incident light. In some embodiments, the substrate 20 includes a semiconductor material. In some embodiments, the substrate includes Si. In some embodiments, the substrate is composed of Si.

In some embodiments, the emitter contact region 102 includes a dopant and has a dopant profile with a peak dopant concentration ranging from, for example, $5\times10^{18}$ cm$^{-3}$ to $5\times10^{20}$ cm$^{-3}$. In some embodiments, the collector contact region 104 includes a dopant and has a dopant profile with a peak dopant concentration ranging from, for example, $5\times10^{18}$ cm$^{-3}$ to $5\times10^{20}$ cm$^{-3}$.

In some embodiments, a method for operating the photo-detecting device includes the steps of: generating a reversed-biased PN junction between the absorption region 10 and the collector contact region 104 and generating a forward-biased PN junction between the absorption region 10 and the emitter contact region 102; and receiving an incident light in the absorption region 10 to generate an amplified photocurrent. For example, the photo-detecting device 100a may include an n-doped emitter contact region 102, a p-doped absorption region 10, and an n-doped collector contact region 104. The PN junction between the n-doped emitter contact region 102 and the p-doped absorption region 10 is forward-biased such that an electron-current is emitted into the p-doped absorption region 10. The PN junction between the n-doped collector contact region 104 and the p-doped absorption region 10 is reverse-biased such that the emitted electron-current is collected by the second electrode 40. When light (e.g., a light at 930 nm, 1310 nm, or any suitable wavelength) is incident on the photo-detecting device 100a, photo-carriers including electrons and holes are generated. The photo-generated electrons are collected by the second electrode 40. The photo-generated holes are directed towards the n-doped emitter contact region 102, which causes the forward-bias to increase due to charge neutrality. The increased forward-bias further increases the electron-current being collected by the second electrode 40, resulting in an amplified electron-current generated by the photo-detecting device 100a. Conversely, if the photo-detecting device 100a includes a p-doped emitter contact region 102, an n-doped absorption region 10, and a p-doped collector region 104, the photo-detecting device 100a may generate an amplified hole-current upon receiving an incident light.

Accordingly, a second electrical signal collected by the collector contact region is greater than the first electrical signal generated by the absorption region, and thus the photo-detecting device is with gain and is with improved signal to noise ratio.

Figure 1B:
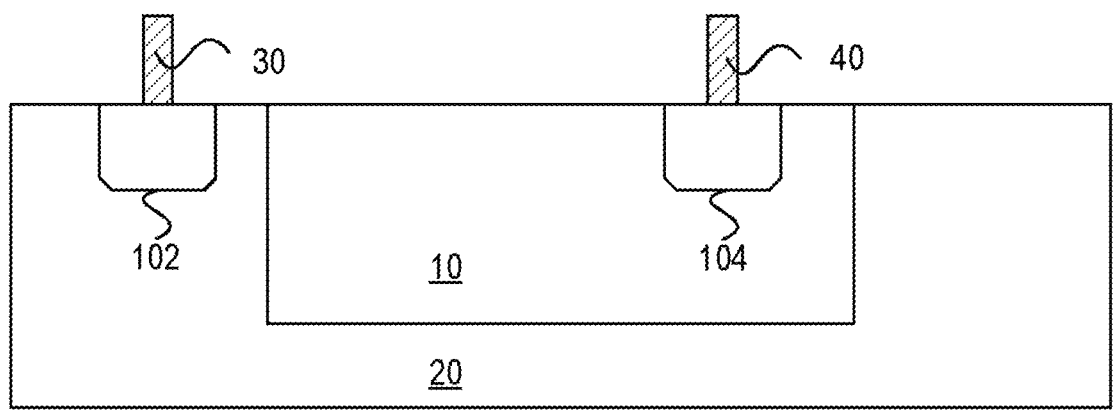

In some embodiments, a method for operating the photo-detecting device capable of collecting electrons includes the steps of: applying a first voltage V1 to the first electrode 30 to form a forward-bias between the emitter contact region 102 and an absorption region 10 of the photo-detecting device to form a first electron current; and applying a second voltage V2 to the second electrode 40 to form a reverse-bias between the collector contact region 104 and the absorption region 10 to collect a portion of the first electron current, where the second voltage V2 is higher than the first voltage V1; receiving an incident light in the absorption region 10 to generate photo-carriers including electrons and holes; and amplifying a portion of the electrons of the photo-carriers to generate a second electron current; and collecting a portion of the second electron current by the collector contact region 104, where the second electron current is larger than the first electron current. FIG. 1B illustrates a cross-sectional view of a photo-detecting device, according to some embodiments. The photo-detecting device 100b in FIG. 1B is similar to the photo-detecting device 100a in FIG. 1A. The difference is described below. The emitter contact region 102 is outside of the absorption region 10 and is in the substrate 20. The material of the emitter contact region 102 is different from the material of the collector contact region 104. In some embodiments, the substrate 20 is of a conductivity type the same as the conductivity type of the absorption region 10. In some embodiments, the substrate 20 includes p-Si. In some embodiment, the absorption region 10 includes p-Ge. In some embodiments, the emitter contact region 102 includes n-Si, and the collector contact region 104 includes n-Ge. In some embodiments, the substrate 20 is of a conductivity type different from the conductivity type of the absorption region 10. By having the emitter contact region 102 being arranged outside of the absorption region 10, the absorption region 10 may have an increased region for absorbing incident light, and thereby improving the device performance. Moreover, by placing the emitter contact region 102 in a material (e.g., Si) that has a lower dark current than the material of the absorption region 10 (e.g., Ge), a photo-detecting device with a lower overall dark current can be achieved.

The operating method of the photo-detecting device 100b in FIG. 1B is similar to the operating method of the photo-detecting device 100a disclosed in FIG. 1A.

Figure 1C:
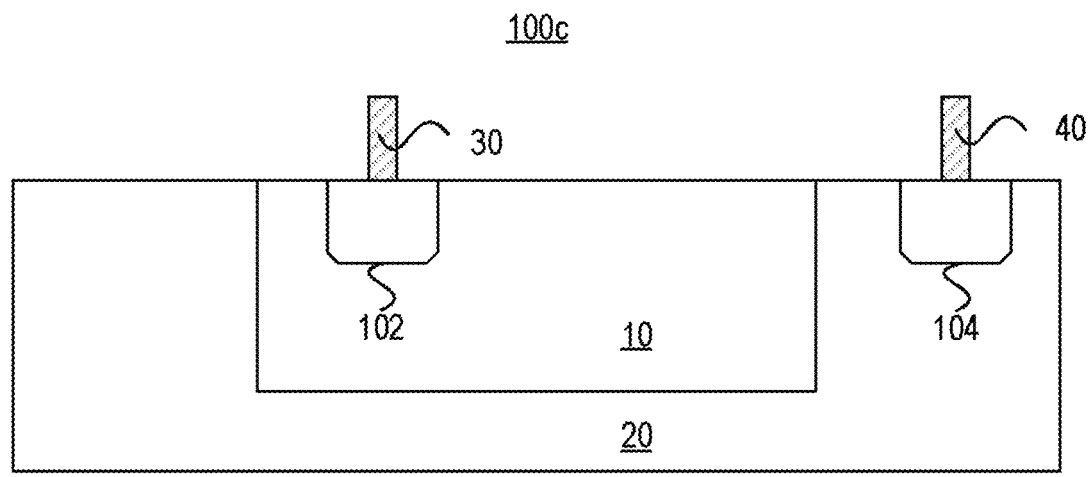

FIG. 1C illustrates a cross-sectional view of a photo-detecting device, according to some embodiments. The photo-detecting device 100c in FIG. 1C is similar to the photo-detecting device 100a in FIG. 1A. The difference is described below. The collector contact region 104 is outside of the absorption region 10 and is in the substrate 20. The material of the emitter contact region 102 is different from the material of the collector contact region 104. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 includes n-Ge, and the collector contact region 104 includes n-Si. In some embodiments, the substrate 20 is of a conductivity type different from the conductivity type of the absorption region 10.

The operating method of the photo-detecting device 100c in FIG. 1C is similar to the operating method of the photo-detecting device 100a disclosed in FIG. 1A.

Figure 1D:
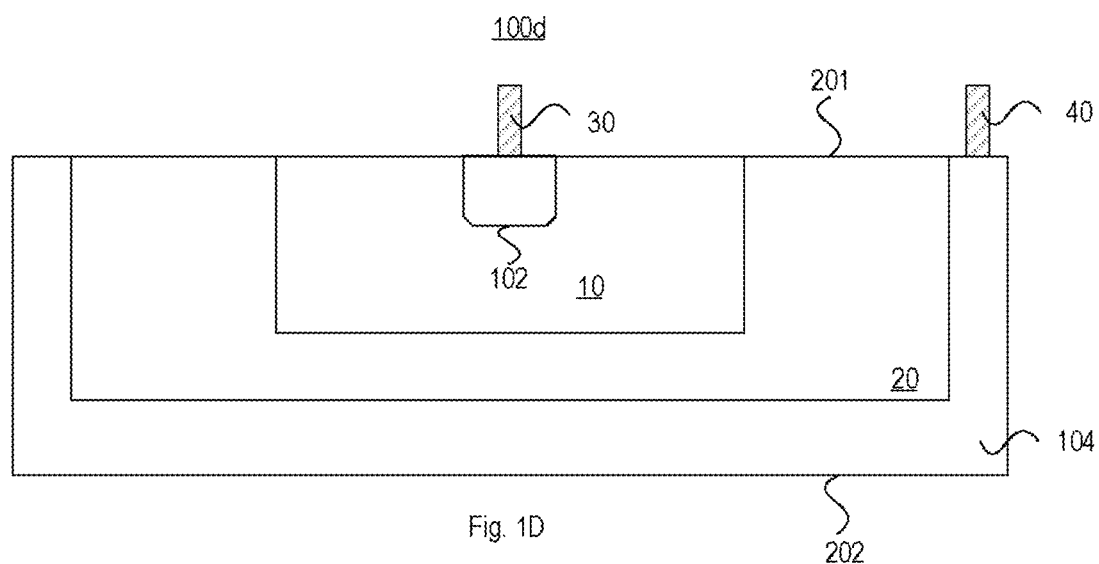

FIG. 1D illustrates a cross-sectional view of a photo-detecting device, according to some embodiments. The photo-detecting device 100d in FIG. 1D is similar to the photo-detecting device 100a in FIG. 1A. The difference is described below. The collector contact region 104 is outside of the absorption region 10 and is in the substrate 20. The material of the emitter contact region 102 is different from the material of the collector contact region 104. In some embodiments, the collector contact region 104 extends from a first surface 201 of the substrate 20 to a second surface 202 of the substrate 20. The second electrode 40 is on the first surface 201 of the substrate 20. In some embodiments, the collector contact region 104 surrounds the absorption region 10 and is physically separated from the absorption region 10. In some embodiments, the emitter contact region 102 is between the first electrode 30 and a portion of the collector contact region 104 along a direction substantially perpendicular to the first surface 201 of the substrate 20. Compared with an embodiment such as the photo-detecting device 100a, the photo-detecting device 100d may be operated at higher speed since a path for transporting the carriers may be shorter between the emitter contact region 102 and the collector contact region 104. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 includes n-Ge, and the collector contact region 104 includes n-Si. In some embodiments, the substrate 20 is of a conductivity type different from the conductivity type of the absorption region 10.

The operating method of the photo-detecting device 100d in FIG. 1D is similar to the operating method of the photo-detecting device 100a disclosed in FIG. 1A.

Figure 1E:
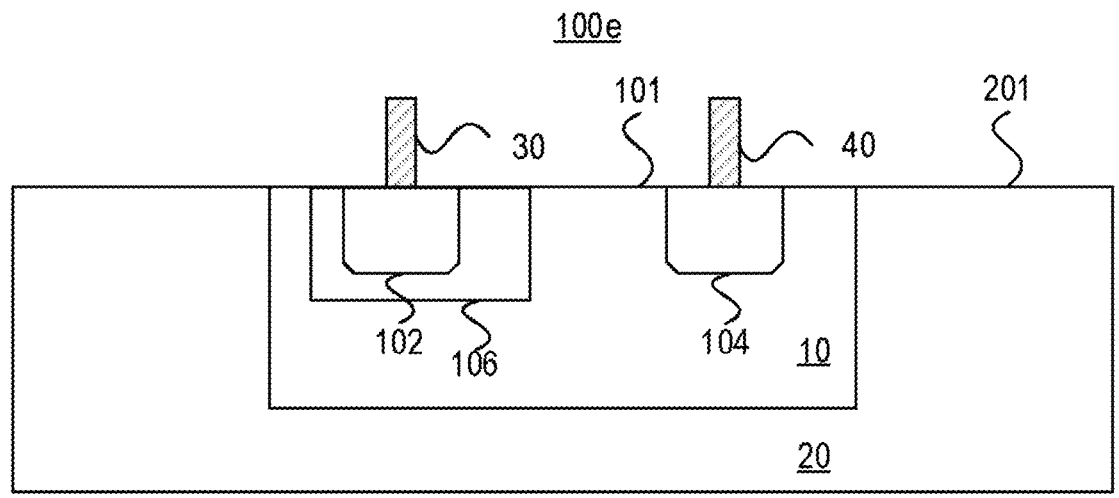

FIG. 1E illustrates a cross-sectional view of a photo-detecting device, according to some embodiments. The photo-detecting device 100e in FIG. 1E is similar to the photo-detecting device 100a in FIG. 1A. The difference is described below. In some embodiments, the photo-detecting device 100e further includes a base region 106 partially or fully surrounding the emitter contact region 102. In some embodiments, the base region 106 is overlapped with a portion of the emitter contact region 102. In some embodiments, the overlapped portion includes at least two different dopants, such as both of the dopant of the base region 106 and the dopant of the emitter contact region 102. In some embodiments, at least a portion of the base region 106 is between the emitter contact region 102 and the collector contact region 104 along a direction substantially parallel to the first surface 201 of the substrate 20. In some embodiments, the emitter contact region 102 is entirely overlapped with the base region 106. In some embodiments, the base region 106 is in the absorption region 10 and is separated from the collector contact region 104. The base region 106 is of a conductivity type different from the conductivity type of the emitter contact region 102. In some embodiments, the material of the emitter contact region 102, the material of the collector contact region 104, and the material of the base region 106 are the same.

In some embodiments, the base region 106 includes a dopant and has a dopant profile with a peak dopant concentration lower than the peak dopant concentration of the emitter contact region 102, for example, the peak dopant concentration of the base region 106 is between $1\times10^{16}$ cm$^{-3}$ to $1\times10^{19}$ cm$^{-3}$. The higher-doped base region 106 (as compared with the absorption region 10) can decrease the size of the depletion region in the base region 106 associated with the emitter contact region 102, which increases the available space for light absorption in the absorption region 10. In some embodiments, the doping of the absorption region 10 may be lowered, such that when the PN junction between the absorption region 10 and the collector contact region 104 is reverse-biased, the depletion region of the absorption region 10 associated with the collector contact region 104 can be further extended into the available space. As a result, the effective region of the absorption region 10 that can receive the incident light is increased, which may further improve the performance of the photo-detection device.

In some embodiments, the base region 106 has a first depth. The emitter contact region 102 has a second depth. The first depth of the base region 106 is greater than the second depth of the emitter contact region 102. The first depth is measured from the first surface 101 of the absorption region 10 to the position where the dopant of the base region 106 is of a background concentration, such as $1\times10^{15}$ cm$^{-3}$. In some embodiments, the second depth is measured from the first surface 101 of the absorption region 10 to the position where the dopant of the emitter contact region 102 is of a background concentration, such as $1\times10^{15}$ cm$^{-3}$.

The operating method of the photo-detecting device 100e in FIG. 1E is similar to the operating method of the photo-detecting device 100a disclosed in FIG. 1A.

Figure 1F:
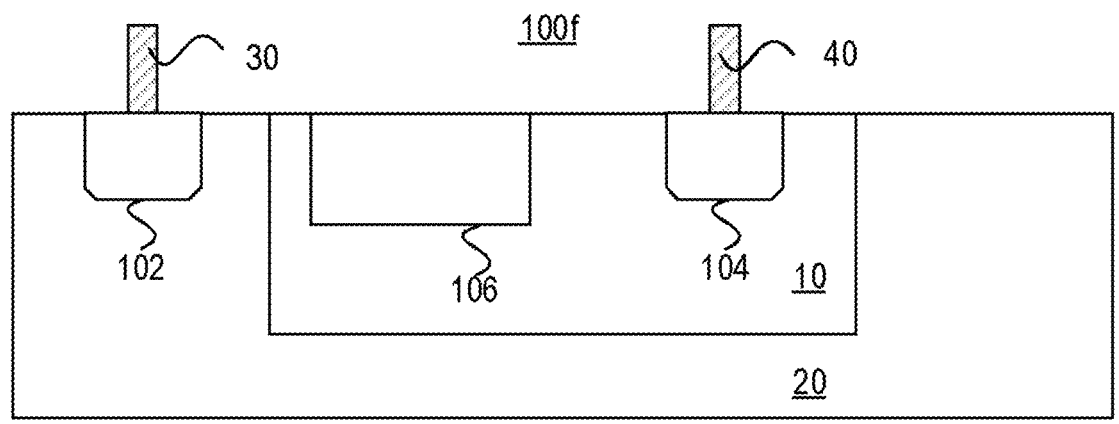

FIG. 1F illustrates a cross-sectional view of a photo-detecting device, according to some embodiments. The photo-detecting device 100f in FIG. 1F is similar to the photo-detecting device 100b in FIG. 1B. The difference is described below. The photo-detecting device 100f further includes a base region 106 in the absorption region 10. The base region 106 is separated from the collector contact region 104 and is also separated from the emitter contact region 102. In some embodiments, at least a portion of the base region 106 is between the emitter contact region 102 and the collector contact region 104. The base region 106 is of a conductivity type different from the conductivity type of the emitter contact region 102. In some embodiments, the material of the collector contact region 104 and the material of the base region 106 are the same. The material of the emitter contact region 102 and the material of the base region 106 are different. In some embodiments, the base region 106 includes a dopant and has a dopant profile with a peak dopant concentration lower than the peak dopant concentration of the emitter contact region 102, for example, the peak dopant concentration of the base region 106 is between $1\times10^{16}$ cm$^{-3}$ to $1\times10^{19}$ cm$^{-3}$. The base region 106 can decrease the size of the depletion region in the base region 106 associated with the emitter contact region 102, which increases the available space for light absorption in the absorption region 10. In some embodiments, the doping of the absorption region 10 may be lowered, such that when the PN junction between the absorption region 10 and the collector contact region 104 is reverse-biased, the depletion region of the absorption region 10 associated with the collector contact region 104 can be further extended into the available space. As a result, the effective region of the absorption region 10 that can receive the incident light is increased, which may further improve the performance of the photo-detection device. The operating method of the photo-detecting device 100f in FIG. 1F is similar to the operating method of the photo-detecting device 100b disclosed in FIG. 1B.

Figure 1G:
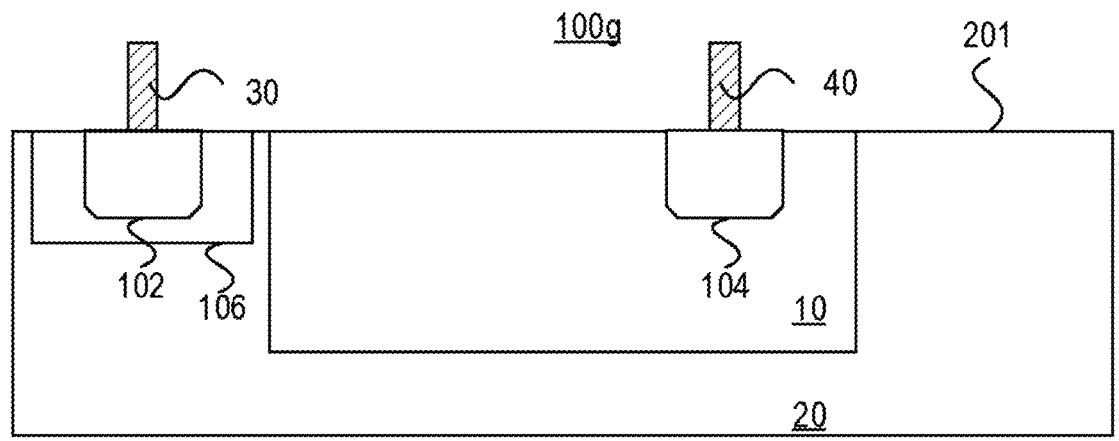

FIG. 1G illustrates a cross-sectional view of a photo-detecting device, according to some embodiments. The photo-detecting device 100g in FIG. 1G is similar to the photo-detecting device 100f in FIG. 1F. The difference is described below. The base region 106 of the photo-detecting device 100g is outside of the absorption region 10. The base region 106 is separated from the collector contact region 104 and fully/partially surrounds the emitter contact region 102 in the substrate 20. In some embodiments, the base region 106 is overlapped with a portion of the emitter contact region 102. In some embodiments, the overlapped portion includes both of the dopant of the base region 106 and the dopant of the emitter contact region 102. In some embodiments, at least a portion of the base region 106 is between the emitter contact region 102 and the collector contact region 104. In some embodiments, the emitter contact region 102 is entirely overlapped with the base region 106. In some embodiments, the material of the emitter contact region 102 and the material of the base region 106 are the same. The material of the collector contact region 104 and the material of the base region 106 are different.

In some embodiments, the base region 106 has a first depth. The emitter contact region 102 has a second depth. The first depth of the base region 106 is greater than the second depth of the emitter contact region 102. The first depth is measured from the first surface 201 of the substrate 20 to the position where the dopant of the base region 106 is of a background concentration, such as $1\times10^{15}$ cm$^{-3}$. In some embodiments, the second depth is measured from the first surface 201 of the substrate 20 to the position where the dopant of the emitter contact region 102 is of a background concentration, such as $1\times10^{15}$ cm$^{-3}$.

The operating method of the photo-detecting device 100g in FIG. 1G is similar to the operating method of the photo-detecting device 100b disclosed in FIG. 1B.

Figure 1H:
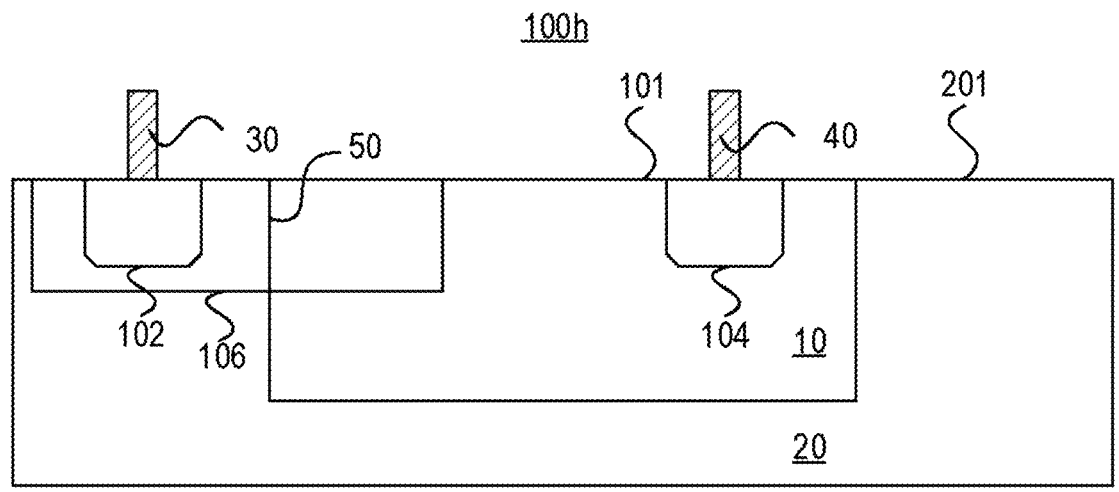

FIG. 1H illustrates a cross-sectional view of a photo-detecting device, according to some embodiments. The photo-detecting device 100h in FIG. 1H is similar to the photo-detecting device 100g in FIG. 1G. The difference is described below. The absorption region 10 includes a first surface 101 of the absorption region 10 substantially flush with the first surface 201 of the substrate 20. The base region 106 extends to both the absorption region 10 and the substrate 20. In some embodiments, the photo-detecting device 100h includes an interface 50 between the absorption region 10 and the substrate 20. The base region 106 is on both sides of the interface 50. A doping concentration of the dopant of the base region 106 at the interface 50 can be between $1\times10^{16}$ cm$^{-3}$ to $1\times10^{19}$ cm$^{-3}$. In some embodiments, the base region 106 includes two different materials. In some embodiments, the base region 106 includes Si and Ge. In some embodiments, the base region 106 includes a first portion and a second portion adjacent to the first portion. The first portion is in the substrate 20. The second portion is in the absorption region 10.

The operating method of the photo-detecting device 100h in FIG. 1H is similar to the operating method of the photo-detecting device 100b disclosed in FIG. 1B.

Figure 1I:
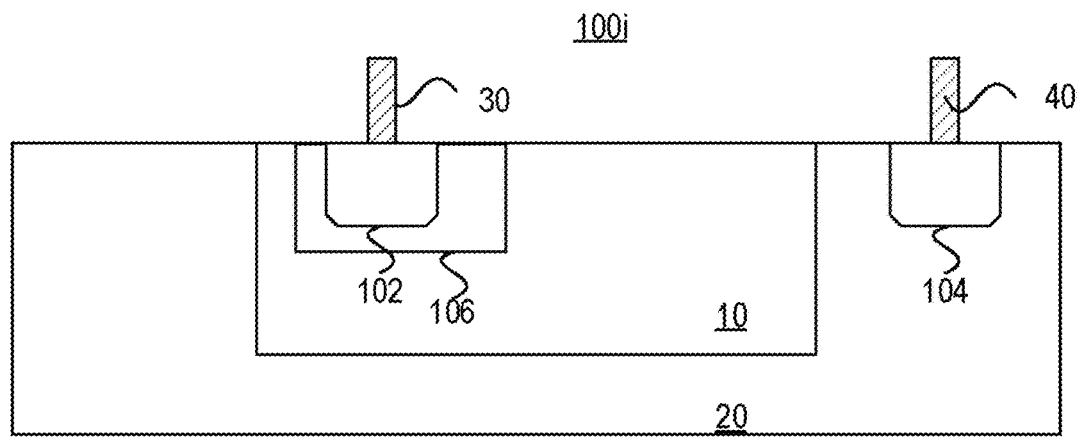

FIG. 1I illustrates a cross-sectional view of a photo-detecting device, according to some embodiments. The photo-detecting device 100i in FIG. 1I is similar to the photo-detecting device 100c in FIG. 1C. The difference is described below. The photo-detecting device further includes a base region 106 in the absorption region 10. The base region 106 is similar the base region 106 mentioned before, such as the base region 106 as described in FIG. 1E.

The operating method of the photo-detecting device 100i in FIG. 1I is similar to the operating method of the photo-detecting device 100c disclosed in FIG. 1C.

Figure 1J:
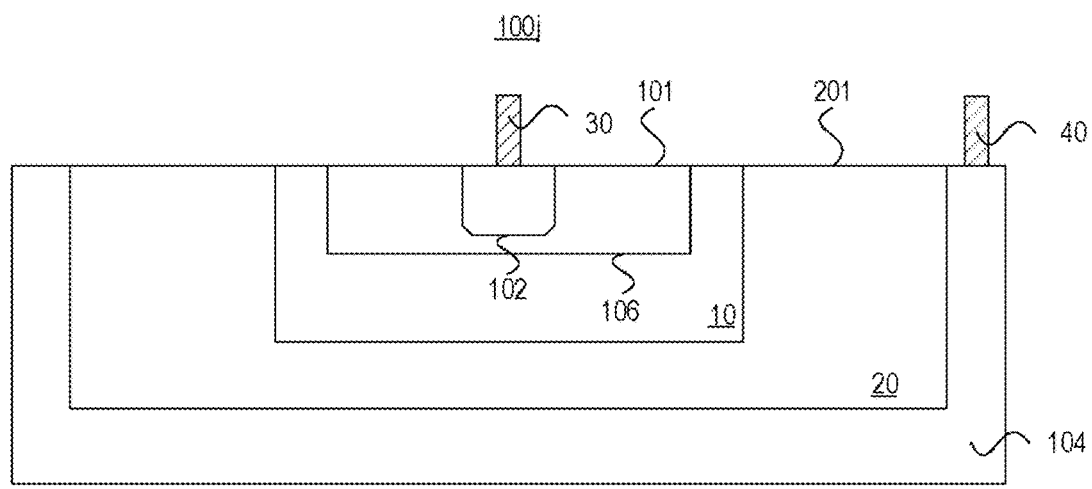

FIG. 1J illustrates a cross-sectional view of a photo-detecting device, according to some embodiments. The photo-detecting device 100j in FIG. 1J is similar to the photo-detecting device 100d in FIG. 100D. The difference is described below. The photo-detecting device 100j further includes a base region 106 in the absorption region 10. The base region 106 is similar to the base region 106 mentioned before, such as the base region 106 as described in FIG. 1E. In some embodiments, at least a portion of the base region 106 is between the emitter contact region 102 and the collector contact region 104 along a direction substantially perpendicular to the first surface 201 of the substrate 20.

In some embodiments, the base region 106 has a first depth. The emitter contact region 102 has a second depth. The first depth of the base region 106 is greater than the second depth of the emitter contact region 102. The first depth is measured from the first surface 101 of the absorption region 10 to the position where the dopant of the base region 106 is of a background concentration, such as $1\times10^{15}$ cm$^{-3}$. In some embodiments, the second depth is measured from the first surface 101 of the absorption region 10 to the position where the dopant of the emitter contact region 102 is of a background concentration, such as 1×10$^{15}$ cm$^{-3}$.

The operating method of the photo-detecting device 100*j* in FIG. 1J is similar to the operating method of the photo-detecting device 100*d* disclosed in FIG. 1D.

Referring to FIGS. 1A through 1J, in some embodiments, at least one of the base region 106, and/or the absorption region 10, and/or the substrate 20, has a conductivity type opposite to both of the conductivity type of the emitter contact region 102 and the conductivity type of the collector contact region 104. In some embodiments, the current path between the emitter contact region 102 and the collector contact region 104 may encounter the base region 106, and/or the absorption region 10, and/or the substrate 20. The photo-detecting device in FIGS. 1A through 1J operates similar to a photo transistor. In some embodiments, the photo-detecting device in FIGS. 1A through 1J includes a forward-biased PN junction coupled to a reversed-biased PN junction.

Figure 2A:
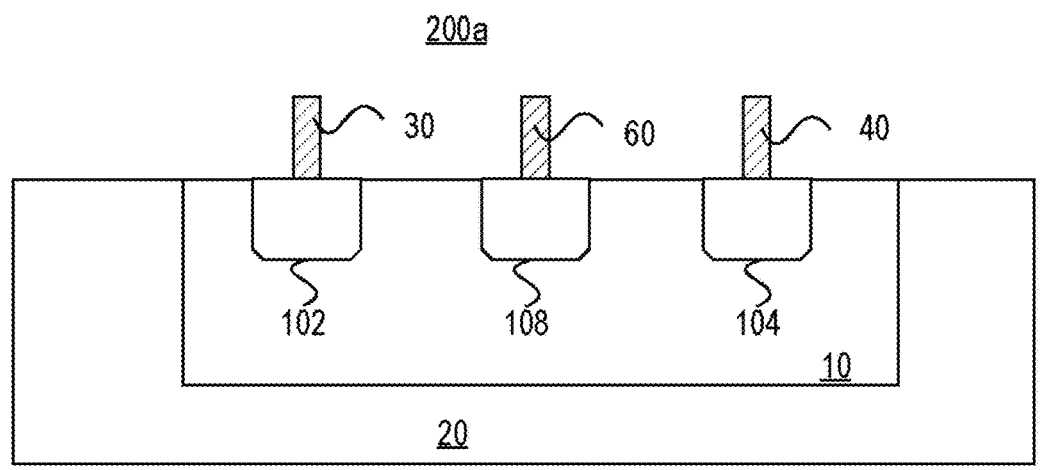
FIGS. 2A-2O illustrate cross-sectional views of a photo-detecting device, according to some embodiments.

FIG. 2A illustrates a cross-sectional view of a photo-detecting device, according to some embodiments. The photo-detecting device 200*a* in FIG. 2A is similar to the photo-detecting device 100*a* in FIG. 1A. The difference is described below. The photo-detecting device 200*a* further includes a base contact region 108 and a third electrode 60 electrically coupled to the base contact region 108. The third electrode 60 serves as a base electrode. In some embodiments, the base contact region 108 is in the absorption region 10. In some embodiments, the base contact region 108 is between the emitter contact region 102 and the collector contact region 104. The base contact region 108 is of a conductivity type different from the conductivity type of the emitter contact region 102 and the collector contact region 104. In some embodiments, the material of the emitter contact region 102, the material of the collector contact region 104, and the material of the base contact region 108 are the same.

In some embodiments, the base contact region 108 includes a dopant and has a dopant profile with a peak dopant concentration ranging from, for example, 5×10$^{18}$ cm$^{-3}$ to 5×10$^{20}$ cm$^{-3}$.

The third electrode 60 is for biasing the base contact region 108. In some embodiments, the third electrode 60 is for evacuating the photo-carriers with opposite type and not collected by the second electrode 40 during the operation of the photo-detecting device. For example, if the photo-detecting device 200*a* is configured to collect electrons, the third electrode 60 is for evacuating holes. Therefore, the photo-detecting device 200*a* can be operated with improved reliability.

The operating method of the photo-detecting device 200*a* in FIG. 2A can include: applying a first voltage V1 to the first electrode 30 to form a forward-bias between the emitter contact region 102 and an absorption region 10 of the photo-detecting device to form a first electron current; and applying a second voltage V2 to the second electrode 40 to form a reverse-bias between the collector contact region 104 and the absorption region 10 to collect a portion of the first electron current, where the second voltage V2 is higher than the first voltage V1; applying a third voltage to a third electrode 60 electrically coupled to a base contact region 108 of the photo-detecting device; receiving an incident light in the absorption region 10 to generate photo-carriers including electrons and holes; and amplifying a portion of the electrons of the photo-carriers to generate a second electron current; and collecting a portion of the second electron current by the collector contact region 104, where the second electron current is larger than the first electron current; and where the third voltage is between the first voltage and the second voltage.

In some embodiments, where the step of the applying the third voltage V3 to the third electrode 60 and the step of applying the first voltage V1 to the first electrode 30 and applying the second voltage V2 to the second electrode 40 are operated at the same time.

In some embodiments, the arrangement of the first electrode 30, second electrode 40 and the third electrode 60, and so the arrangement of the emitter contact region 102, collector contact region 104 and the base contact region 108 can be different. For example, in some embodiments, the first electrode 30 is between the second electrode 40 and the third electrode 60. The emitter contact region 102 is between the base contact region 108 and the collector contact region 104.

Figure 2B:
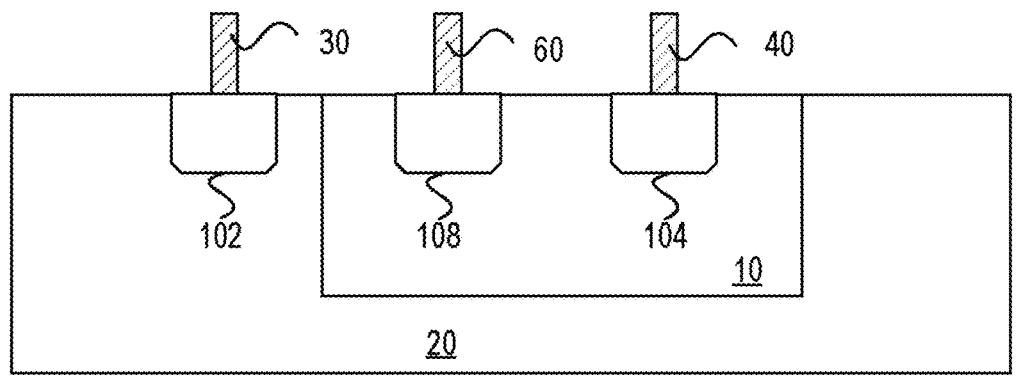

FIG. 2B illustrates a cross-sectional view of a photo-detecting device, according to some embodiments. The photo-detecting device 200*b* in FIG. 2B is similar to the photo-detecting device 200*a* in FIG. 2A. The difference is described below. The emitter contact region 102 is outside of the absorption region 10 and is in the substrate 20. The material of the emitter contact region 102 is different from the material of the base contact region 108. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 includes n-Si, and the collector contact region 104 includes n-Ge. In some embodiments, the substrate 20 is of a conductivity type different from the conductivity type of the absorption region 10.

The operating method of the photo-detecting device 200*b* in FIG. 2B is similar to the operating method of the photo-detecting device 200*a* disclosed in FIG. 2A.

Figure 2C:
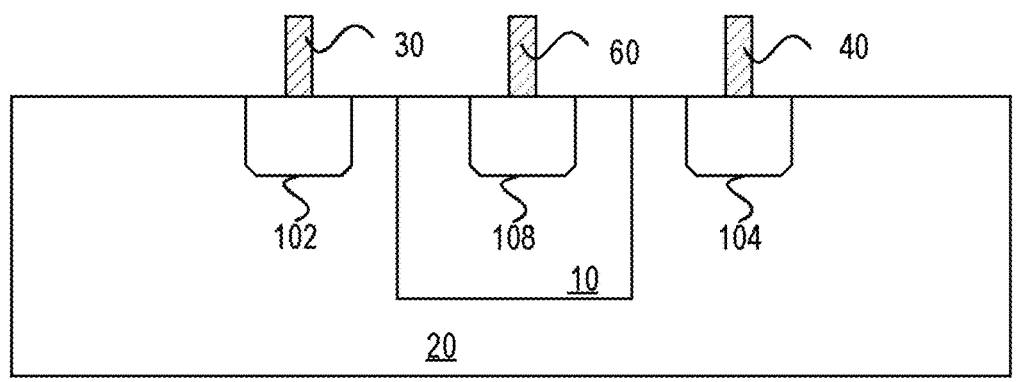

FIG. 2C illustrates a cross-sectional view of a photo-detecting device, according to some embodiments. The photo-detecting device 200*c* in FIG. 2C is similar to the photo-detecting device 200*a* in FIG. 2A. The difference is described below. The emitter contact region 102 and the collector contact region 104 are outside of the absorption region 10 and are in the substrate 20. The material of the emitter contact region 102 is different from the material of the base contact region 108. The material of the collector contact region 104 is different from the material of the base contact region 108. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 and the collector contact region 104 include n-Si. In some embodiments, the substrate 20 is of a conductivity type different from the conductivity type of the absorption region 10.

The operating method of the photo-detecting device 200*c* in FIG. 2C is similar to the operating method of the photo-detecting device 200*a* disclosed in FIG. 2A.

Figure 2D:
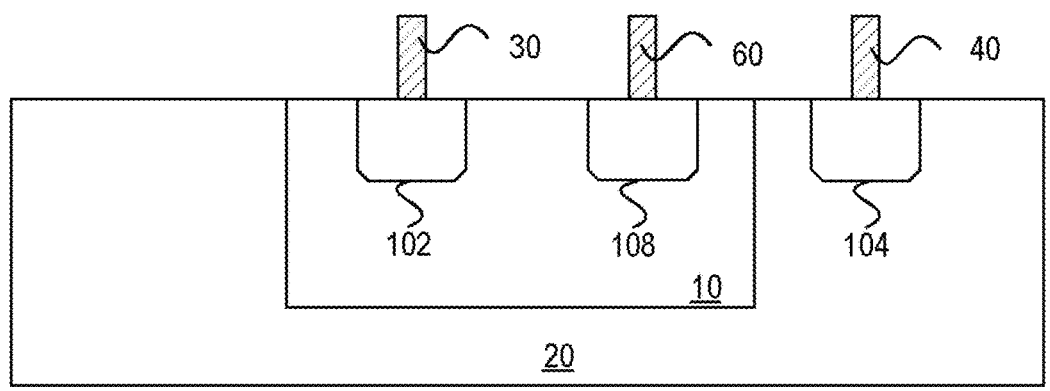

FIG. 2D illustrates a cross-sectional view of a photo-detecting device, according to some embodiments. The photo-detecting device 200*d* in FIG. 2D is similar to the photo-detecting device 200*a* in FIG. 2A. The difference is described below. The collector contact region 104 is outside of the absorption region 10 and is in the substrate 20. The material of the collector contact region 104 is different from the material of the base contact region 108. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 includes n-Ge, and the collector contact region 104 includes n-Si. In some embodiments, the substrate 20 is of a conductivity type different from the conductivity type of the absorption region 10.

The operating method of the photo-detecting device 200d in FIG. 2D is similar to the operating method of the photo-detecting device 200a disclosed in FIG. 2A.

Figure 2E:
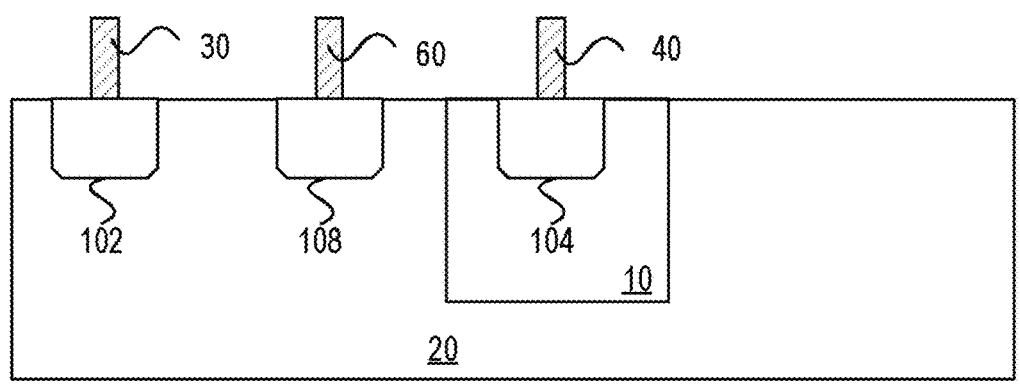

FIG. 2E illustrates a cross-sectional view of a photo-detecting device, according to some embodiments. The photo-detecting device 200e in FIG. 2E is similar to the photo-detecting device 200a in FIG. 2A. The difference is described below. The emitter contact region 102 and the base contact region 108 are outside of the absorption region 10 and are in the substrate 20. The material of the emitter contact region 102 is different from the material of the collector contact region 104. The material of the emitter contact region 102 is the same as the material of the base contact region 108. In some embodiments, the substrate 20 is of a conductivity type same as the conductivity type of the absorption region 10. In some embodiments, the substrate 20 includes p-Si. In some embodiments, the absorption region includes p-Ge. The emitter contact region 102 includes n-Si, and the base contact region 108 includes p-Si. In some embodiments, the substrate 20 is of a conductivity type different from the conductivity type of the absorption region 10.

The operating method of the photo-detecting device 200e in FIG. 2E is similar to the operating method of the photo-detecting device 200a disclosed in FIG. 2A.

Figure 2F:
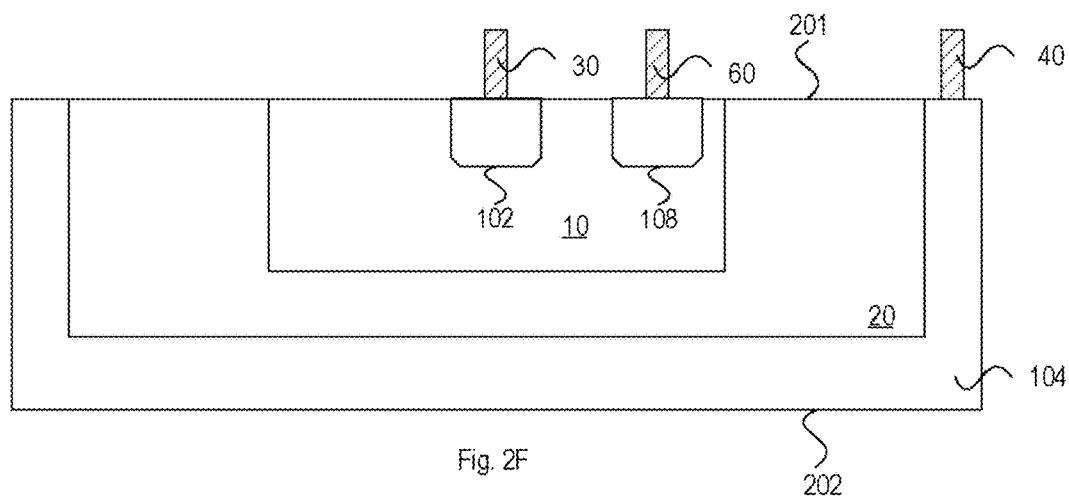

FIG. 2F illustrates a cross-sectional view of a photo-detecting device, according to some embodiments. The photo-detecting device 200f in FIG. 2F is similar to the photo-detecting device 200a in FIG. 2A. The difference is described below. The collector contact region 104 is outside of the absorption region 10 and is in the substrate 20. The material of the emitter contact region 102 and the base contact region are different from the material of the collector contact region 104. In some embodiments, the collector contact region 104 extends from a first surface 201 of the substrate 20 to a second surface 202 of the substrate 20. In some embodiments, the collector contact region 104 surrounds the absorption region 10 and is physically separated from the absorption region 10. The second electrode 40 is on the first surface 201. In some embodiments, the emitter contact region 102 is between the first electrode 30 and a portion of the collector contact region 104 along a direction substantially perpendicular to the first surface 201 of the substrate 20. In some embodiments, the substrate 20 is of a conductivity type the same as the conductivity type of the absorption region 10. In some embodiments, the substrate 20 includes p-Si. In some embodiments, the absorption region 10 includes p-Ge. In some embodiments, the emitter contact region 102 includes n-Ge, and the collector contact region 104 includes n-Si. In some embodiments, the substrate 20 is of a conductivity type different from the conductivity type of the absorption region 10.

The operating method of the photo-detecting device 200f in FIG. 2F is similar to the operating method of the photo-detecting device 200a disclosed in FIG. 2A.

Figure 2G:
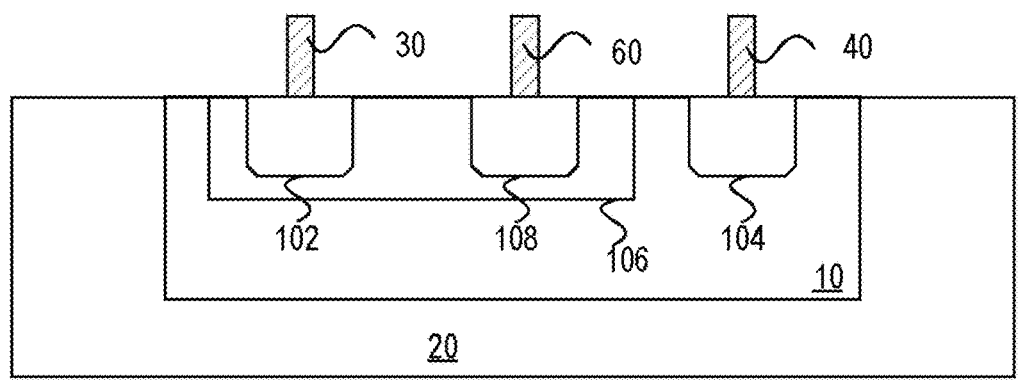

FIG. 2G illustrates a cross-sectional view of a photo-detecting device, according to some embodiments. The photo-detecting device 200g in FIG. 2G is similar to the photo-detecting device 200a in FIG. 2A. The difference is described below. The photo-detecting device 200g further includes a base region 106 in the absorption region 10 and is separated from the collector contact region 104. The base region 106 fully/partially surrounds the emitter contact region 102 and the base contact region 108. In some embodiments, the base region 106 is overlapped with a portion of the emitter contact region 102 and a portion of the base contact region 108. In some embodiments, the overlapped portion includes at least two different dopants. In some embodiments, the overlapped portion includes the dopant of the base region 106, the dopant of the emitter contact region 102, and the dopant of the base contact region 108. In some embodiments, the dopant of the base region 106 and the dopant of the base contact region 108 are the same. In some embodiments, the emitter contact region 102 is entirely overlapped with the base region 106. In some embodiments, the base contact region 108 is entirely overlapped with the base region 106. The base region 106 is of a conductivity type different from the conductivity type of the emitter contact region 102 and the conductivity type of the collector contact region 104. The conductivity type of the base region 106 is the same as the conductivity type of the base contact region 108. In some embodiments, the material of the emitter contact region 102, the material of the collector contact region 104, the material of the base contact region 108, and the material of the base region 106 are the same.

In some embodiments, the base region 106 includes a dopant and has a dopant profile with a peak dopant concentration lower than the peak dopant concentration of the emitter contact region 102, for example, the peak dopant concentration of the base region 106 is between $1\times10^{16}$ cm$^{-3}$ to $1\times10^{19}$ cm$^{-3}$. The base region 106 can decrease the size of the depletion region associated with the emitter contact region 102, which increases the available space for light absorption in the absorption region 10. In some embodiments, the doping of the absorption region 10 may be lowered, such that when the PN junction between the absorption region 10 and the collector contact region 104 is reverse-biased, the depletion region of the absorption region 10 can be further extended into the available space. As a result, the effective region of the absorption region 10 that can receive the incident light is increased, which may further improve the performance of the photo-detection device.

The operating method of the photo-detecting device 200g in FIG. 2G is similar to the operating method of the photo-detecting device 200a disclosed in FIG. 2A.

Figure 2H:
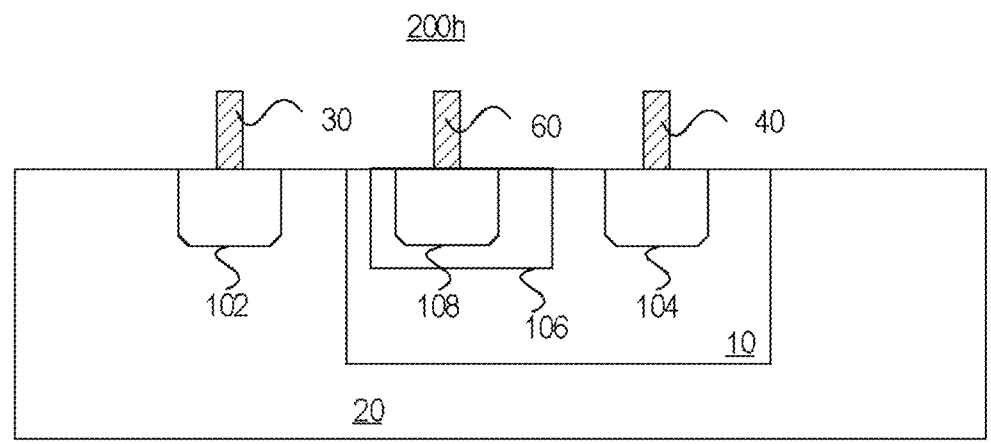

FIG. 2H illustrates a cross-sectional view of a photo-detecting device, according to some embodiments. The photo-detecting device 200h in FIG. 2H is similar to the photo-detecting device 200b in FIG. 2B. The difference is described below. The photo-detecting device 200h further includes a base region 106 in the absorption region 10. The base region 106 is similar to the base region 106 mentioned before, such as the base region 106 as described in FIG. 2G. The difference is that the base region 106 is separated from the emitter contact region 102. For example, if the third electrode 60 is between the first electrode 30 and the second electrode 40, and if the base contact region 108 is between the emitter contact region 102 and the collector contact region 104, the base contact region 106 is separated from the emitter contact region 102.

The operating method of the photo-detecting device 200h in FIG. 2H is similar to the operating method of the photo-detecting device 200b disclosed in FIG. 2B.

Figure 2I:
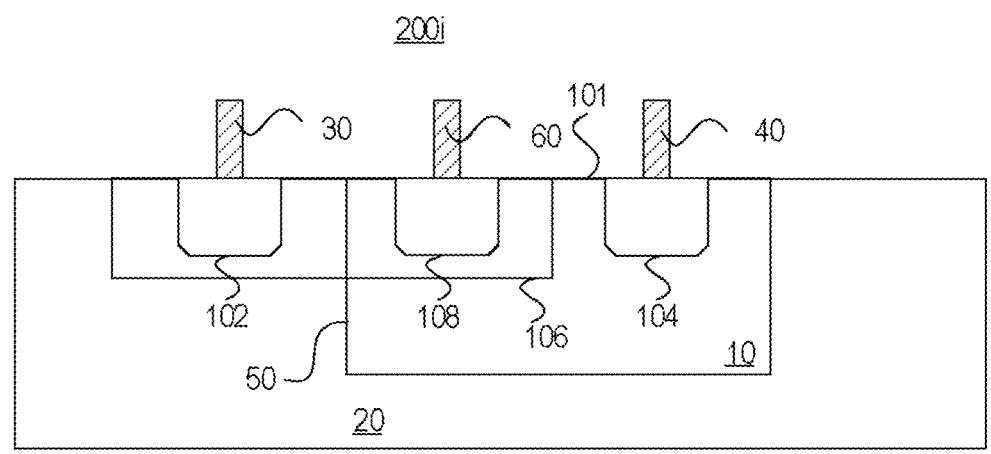

FIG. 2I illustrates a cross-sectional view of a photo-detecting device, according to some embodiments. The photo-detecting device 200i in FIG. 2I is similar to the photo-detecting device 200h in FIG. 2H. The difference is described below. The absorption region 10 includes a first surface 101 substantially flush with the first surface 201 of the substrate 20. The base region 106 is in both of the absorption region 10 and the substrate 20. In some embodiments, the photo-detecting device 200i includes an interface 50 between the absorption region 10 and the substrate 20. The base region 106 is on both sides of the interface 50. A concentration at the interface 50 between the absorption region 10 and the substrate 20 covered by the base region 106 is between $1\times10^{16}$ cm$^{-3}$ to $1\times10^{19}$ cm$^{-3}$. In some embodiments, the base region 106 includes two different materials. In some embodiments, the base region 106 includes Si and Ge. In some embodiments, the base region 106 includes a first portion and a second portion adjacent to the first portion. The first portion is in the substrate 20. The second portion is in the absorption region 10.

The operating method of the photo-detecting device 200i in FIG. 2I is similar to the operating method of the photo-detecting device 200h disclosed in FIG. 2H.

Figure 2J:
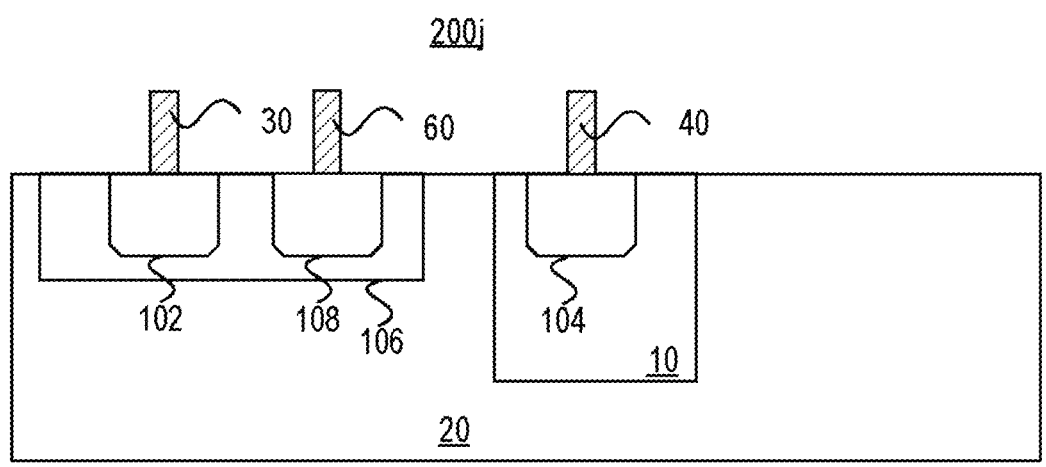

FIG. 2J illustrates a cross-sectional view of a photo-detecting device, according to some embodiments. The photo-detecting device 200j in FIG. 2J is similar to the photo-detecting device 200e in FIG. 2E. The difference is described below. The photo-detecting device 200j further includes a base region 106. The base region 106 is similar to the base region 106 mentioned before, such as the base region 106 as described in FIG. 2G.

The operating method of the photo-detecting device 200j in FIG. 2J is similar to the operating method of the photo-detecting device 200e disclosed in FIG. 2E.

Figure 2K:
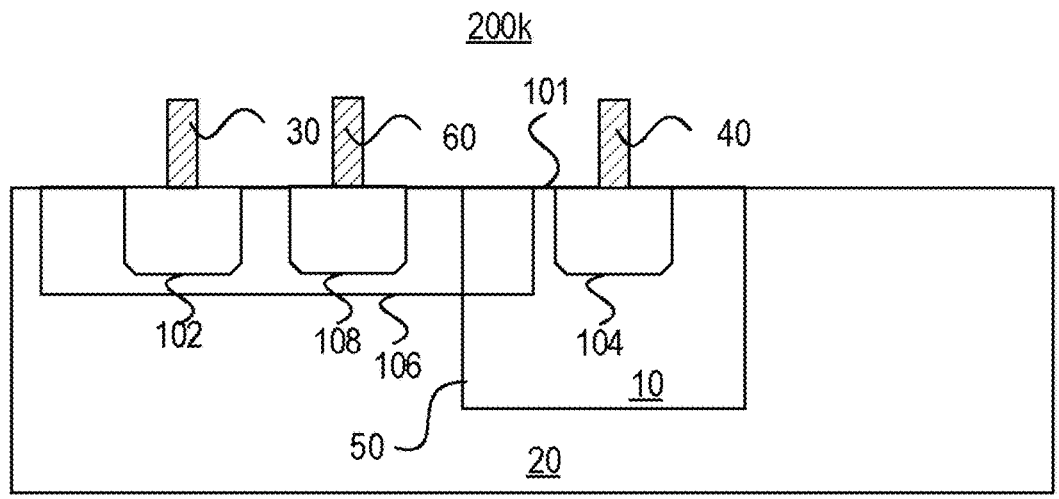

FIG. 2K illustrates a cross-sectional view of a photo-detecting device, according to some embodiments. The photo-detecting device 200k in FIG. 2K is similar to the photo-detecting device 200j in FIG. 2J. The difference is described below. The absorption region 10 includes a first surface 101 substantially flush with the first surface 201 of the substrate 20. The base region 106 is in both of the absorption region 10 and the substrate 20. In some embodiments, the photo-detecting device 200k includes an interface 50 between the absorption region 10 and the substrate 20. The base region 106 is on both sides of the interface 50. A concentration at the interface 50 between the absorption region 10 and the substrate 20 covered by the base region 106 is between $1\times10^{16}$ cm$^{-3}$ to $1\times10^{19}$ cm$^{-3}$. In some embodiments, the base region 106 includes two different materials. In some embodiments, the base region 106 includes Si and Ge. In some embodiments, the base region 106 includes a first portion and a second portion adjacent to the first portion. The first portion is in the substrate. The second portion is in the absorption region 10.

The operating method of the photo-detecting device 200k in FIG. 2k is similar to the operating method of the photo-detecting device 200hj disclosed in FIG. 2J.

Figure 2L:
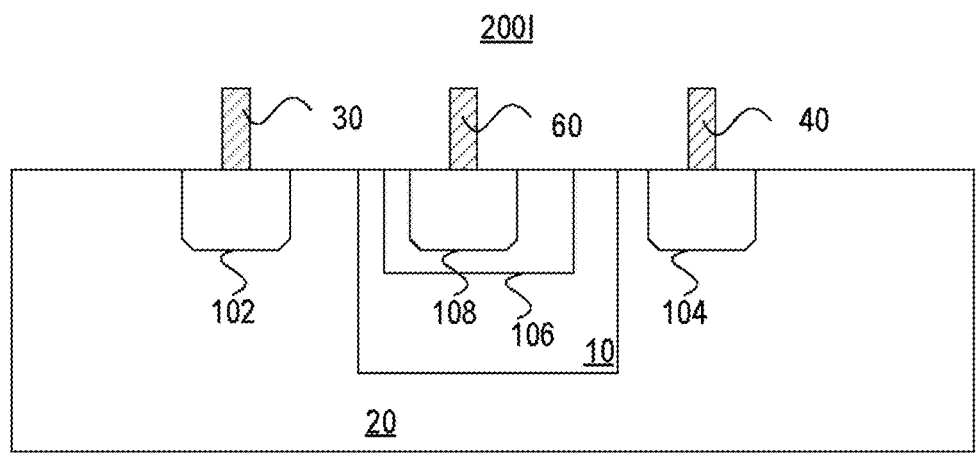

FIG. 2L illustrates a cross-sectional view of a photo-detecting device, according to some embodiments. The photo-detecting device 200l in FIG. 2L is similar to the photo-detecting device 200c in FIG. 2C. The difference is described below. The photo-detecting device 200j further includes a base region 106. The base region 106 is similar to the base region 106 mentioned before, such as the base region 106 as described in FIG. 2G.

The operating method of the photo-detecting device 200l in FIG. 2L is similar to the operating method of the photo-detecting device 200c in FIG. 2C.

Figure 2M:
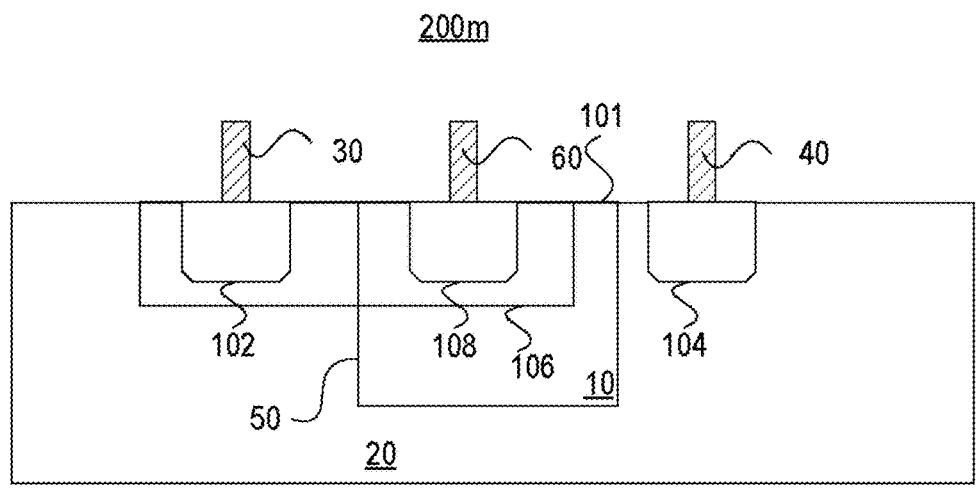

FIG. 2M illustrates a cross-sectional view of a photo-detecting device, according to some embodiments. The photo-detecting device 200m in FIG. 2M is similar to the photo-detecting device 200l in FIG. 2L. The difference is described below. The absorption region 10 includes a first surface 101 substantially flush with the first surface 201 of the substrate 20. The base region 106 is in both of the absorption region 10 and the substrate 20. In some embodiments, the photo-detecting device 200k includes an interface 50 between the absorption region 10 and the substrate 20. The base region 106 is on both sides of the interface 50. A concentration at the interface 50 between the absorption region 10 and the substrate 20 covered by the base region 106 is between $1\times10^{16}$ cm$^{-3}$ to $1\times10^{19}$ cm$^{-3}$. In some embodiments, the base region 106 includes two different materials. In some embodiments, the base region 106 includes Si and Ge. In some embodiments, the base region 106 includes a first portion and a second portion adjacent to the first portion. The first portion is in the substrate. The second portion is in the absorption region 10.

The operating method of the photo-detecting device 200m in FIG. 2M is similar to the operating method of the photo-detecting device 200l in FIG. 2L.

Figure 2N:
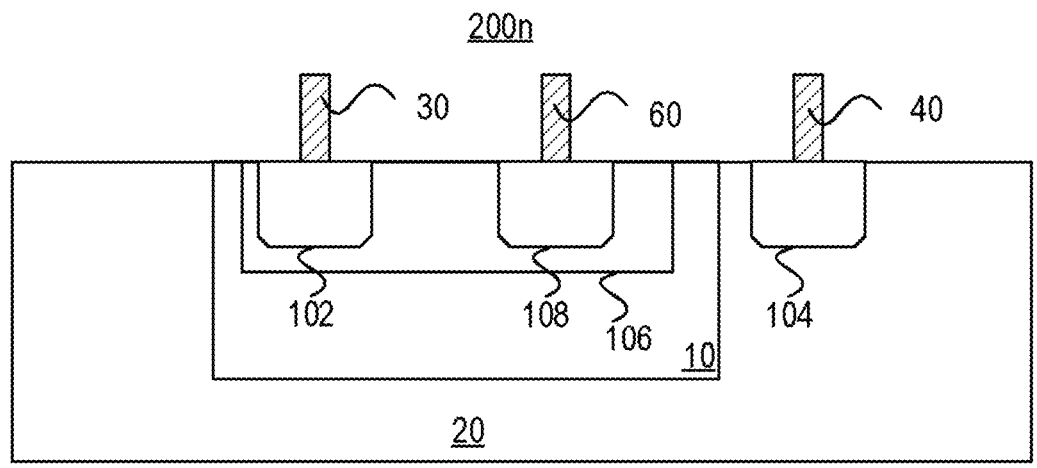

FIG. 2N illustrates a cross-sectional view of a photo-detecting device, according to some embodiments. The photo-detecting device 200n in FIG. 2N is similar to the photo-detecting device 200d in FIG. 2D. The difference is described below. The photo-detecting device 200n further includes a base region 106. The base region 106 is similar to the base region 106 mentioned before, such as the base region 106 as described in FIG. 2G.

The operating method of the photo-detecting device 200n in FIG. 2N is similar to the operating method of the photo-detecting device 200d in FIG. 2D.

Figure 2O:
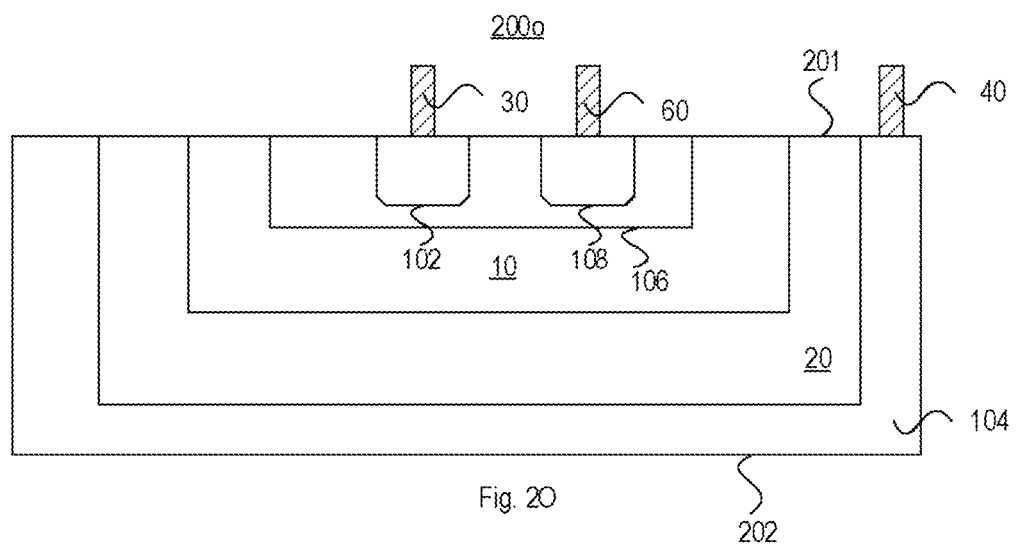

FIG. 2O illustrates a cross-sectional view of a photo-detecting device, according to some embodiments. The photo-detecting device 200o in FIG. 2O is similar to the photo-detecting device 200f in FIG. 2F. The difference is described below. The photo-detecting device 200o further includes a base region 106. The base region 106 is similar to the base region 106 mentioned before, such as the base region 106 as described in FIG. 2G.

The operating method of the photo-detecting device 200o in FIG. 2O is similar to the operating method of the photo-detecting device 200f in FIG. 2F.

The photo-detecting device in FIGS. 2A through 2O can operate similar to a photo transistor. The photo-detecting device in FIGS. 2A through 2O includes a forward-biased PN junction coupled to a reversed-biased PN junction.

Referring to FIGS. 2A through 2O, in some embodiments, at least one of base contact region 108, and/or base region 106, and/or the absorption region 10, and/or the substrate 20, has a conductivity type opposite to both of the conductivity type of the emitter contact region 102 and the conductivity type of the collector contact region 104. In some embodiments, the current path between the emitter contact region 102 and the collector contact region 104 may encounter the base contact region 108, and/or the base region 106, and/or the absorption region 10, and/or the substrate 20.

Referring to FIGS. 1A through 1J and FIGS. 2A through 2O, in some embodiments, the conductivity type of the regions can be opposite in the previous embodiments when collecting holes. Taking the photo-detecting device 100a in FIG. 1A as an example, the conductivity type of the emitter contact region 102 is p-type. The conductivity type of the collector contact region 104 is p-type. The photo-detecting device 100a is capable of collecting holes, which are further processed by a circuitry. A method for operating the photo-detecting device capable of collecting holes, includes the steps of: applying a first voltage V1 to the first electrode 30 and applying a second voltage V2 to the second electrode 40 to generate a first current flowing from the first electrode 30 to the second electrode 40, where the first voltage V1 is higher than the second voltage V2; and receiving an incident light in the absorption region to generate a second current flowing from the first electrode 30 to the second electrode 40 after the absorption region 10 generates photo-carriers from the incident light, where the second current is larger than the first current.

Taking the photo-detecting device 200a in FIG. 2A as another example, in some embodiments, the conductivity type of the emitter contact region 102 is p-type. The conductivity type of the collector contact region 104 is p-type. The conductivity type of the base contact region 108 is n-type. The method for operating the photo-detecting device capable of collecting holes, further includes: applying a third voltage V3 to the third electrode 60, where the third voltage is between the first voltage V1 and the second voltage V2. In some embodiments, where the step of the applying a third voltage V3 to the third electrode 60 and the step of applying a first voltage V1 to the first electrode 30 and applying a second voltage V2 to the second electrode 40 are operated at the same time.

Figure 3A:
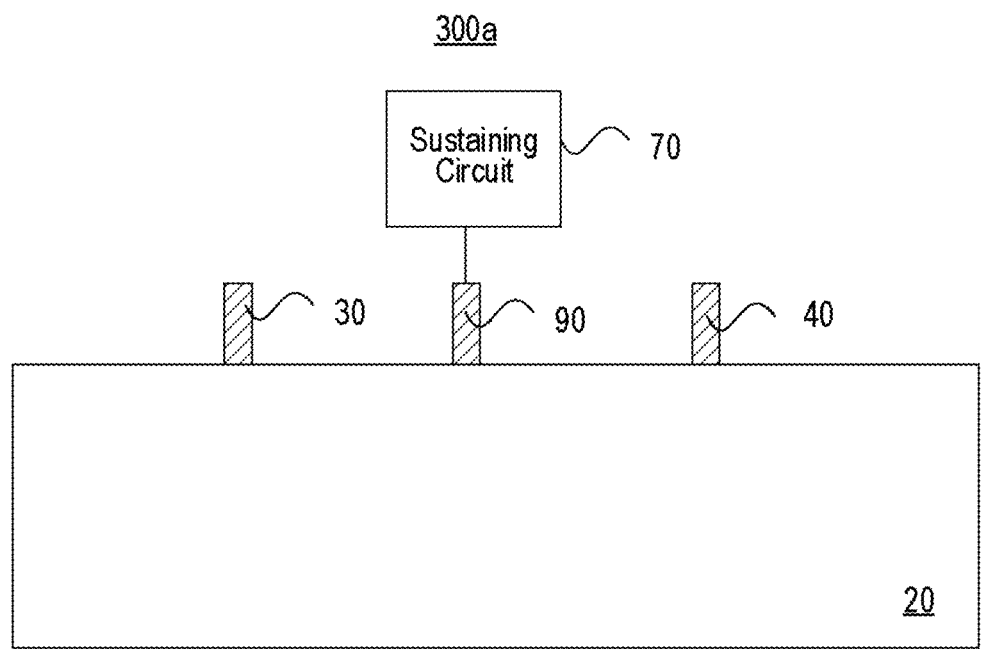
FIGS. 3A-3D illustrate cross-sectional views of a photo-current amplification apparatus, according to some embodiments.
Figure 3B:
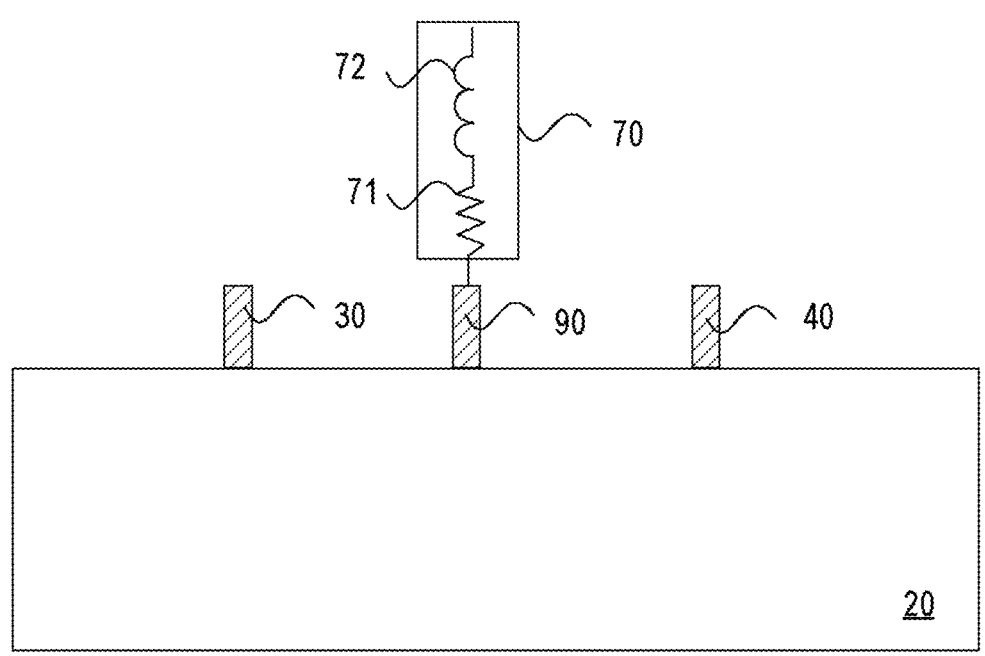

FIG. 3A illustrate cross-sectional views of a photo-current amplification apparatus, according to some embodiments. The photo-current amplification apparatus 300a can include a photo-detecting device substantially the same as any embodiments in FIGS. 1A through 1J and FIGS. 2A through 2O, and the photo-current amplification apparatus 300a further includes a includes a sustaining circuit 70 electrically coupled an electrode 90. In some embodiments, the electrode 90 is the same as the third electrode 60. The sustaining circuit 70 controls the gain of the photo-detecting device for a desired period of time, such as but not limited to keeping the gain for picosecond-to-millisecond duration. In some embodiments, the sustaining circuit 70 includes a passive element electrically coupled to the electrode 90. In some embodiments, the passive element includes, but is not limited to a resistor, an inductor, or a capacitor. In some embodiments, the sustaining circuit 70 may include multiple passive elements electrically coupled to each other in parallel or in series. For example, referring to FIG. 3B, a photo-current amplification apparatus 300b includes two passive elements 71, 72 electrically coupled to each other. In some embodiments, the passive element 71 is a resistor, and the passive element 72 is an inductor. The resistor and the inductor are connected in series. In some embodiments, the sustaining circuit 70 may be fabricated on another substrate and integrated/co-packaged with the photo-detecting device via die/wafer bonding or stacking. In some embodiments, the photo-current amplification apparatus 300a, 300d, 300c, 300d include a bonding layer (not shown) between the sustaining circuit 70 and the photo-detecting device. The bonding layer may include any suitable material such as oxide or semiconductor or metal or alloy.

Figure 3C:
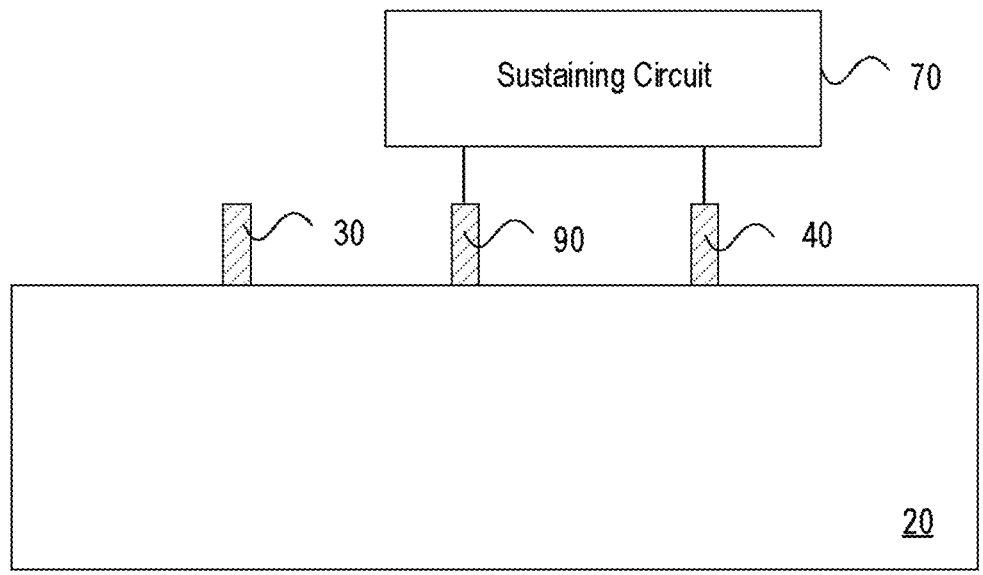
Figure 3D:
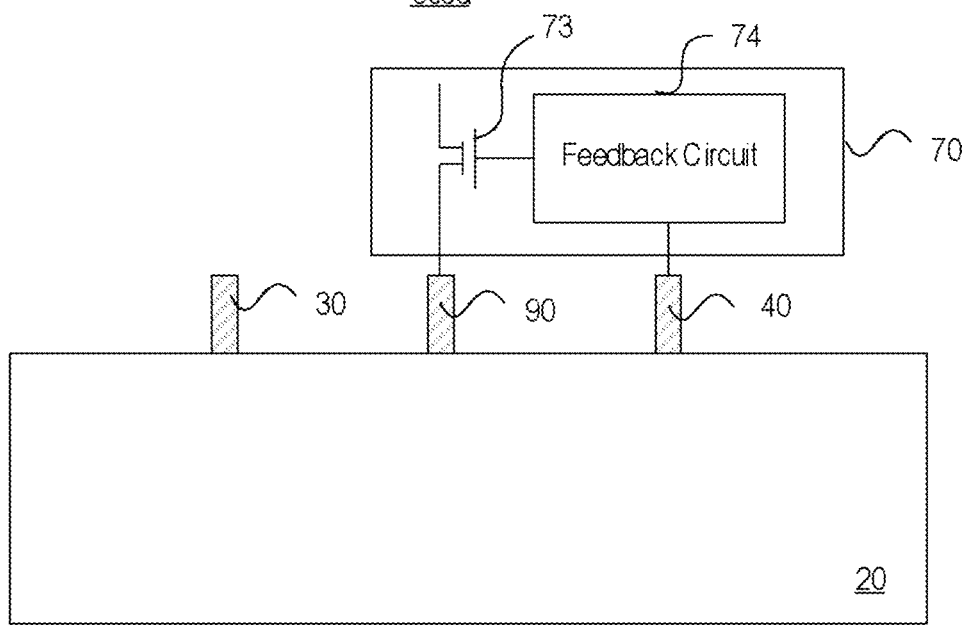

FIG. 3C illustrate cross-sectional views of a photo-current amplification apparatus, according to some embodiments. The photo-current amplification apparatus 300c can include a photo-detecting device substantially the same as any embodiments in FIGS. 1A through 1J and FIGS. 2A through 2O, and the photo-current amplification apparatus 300c further includes a sustaining circuit 70 electrically coupled to both of the electrode 90 and the second electrode 40 of the photo-detecting device. Referring to FIG. 3D, FIG. 3D illustrate cross-sectional views of a photo-current amplification apparatus, according to some embodiments. In some embodiments, the sustaining circuit 70 of the photo-current amplification apparatus 300d includes an active element 73 and a feedback circuit 74. The active element 73 is electrically coupled to the electrode 90. The feedback circuit 74 is electrically coupled to active element 73 and the second electrode 40. The feedback circuit 74 controls the active element 73 of the sustaining circuit 70 based on the carrier collection through the second electrode 40, for example, if the feedback circuit 74 detects a second electrical signal that is greater than the first electrical signal generated by the absorption region 10, the feedback circuit 74 can turn on the active element 73 so as to evacuate the carriers under the electrode 90, which can reduce the remaining time of the second electrical signal, so as to controls the gain of the photo-detecting device for a desired period of time. Accordingly, the photo-detecting device 300d may be operated at higher speed. In some embodiments, the active element 73 includes, but is not limited to a transistor or a switch.

Figure 4A:
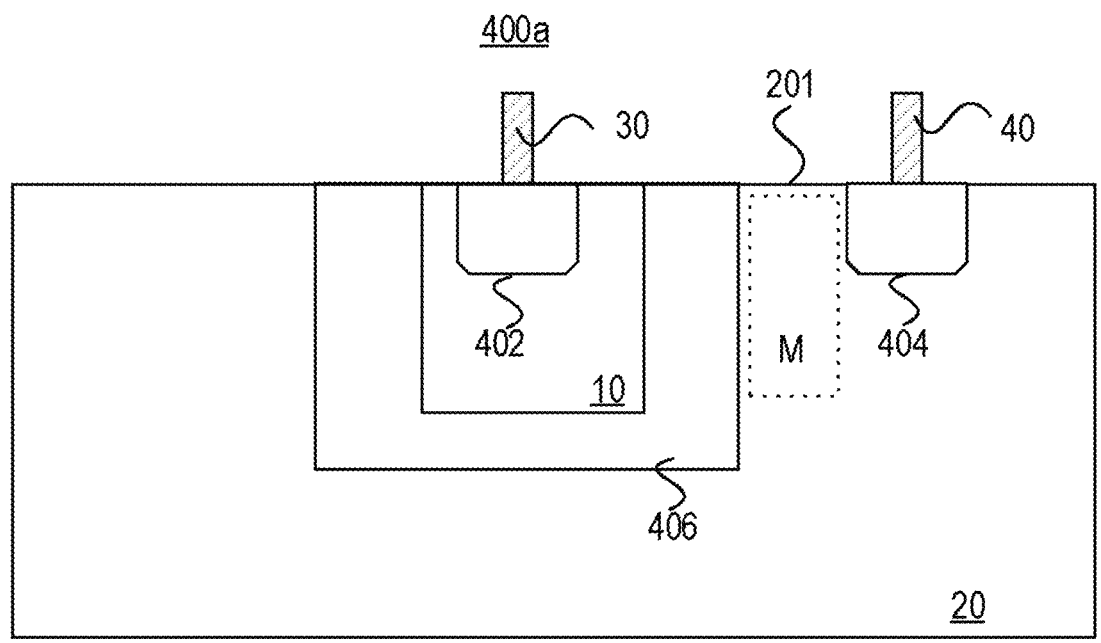
FIGS. 4A-4C illustrate cross-sectional views of a photo-detecting device, according to some embodiments.

FIG. 4A illustrates a cross-sectional view of a photo-detecting device, according to some embodiments. The photo-detecting device 400a includes an absorption region 10 and a substrate 20 supporting the absorption region 10. In some embodiments, the absorption region 10 is entirely embedded or partially embedded in the substrate 20.

The photo-detecting device 400a further includes a first contact region 402 and a second contact region 404 physically separated from the first contact region 402. In some embodiments, the first contact region 402 is in the absorption region 10. The second contact region 404 is in the substrate 20. The second contact region 404 is for collecting the photo-carriers generated from the absorption region 10.

The first contact region 402 is of a conductivity type. The second contact region 404 is of a conductivity type different from the conductivity type of the first contact region 402. In some embodiments, the absorption region 10 is of a conductivity type different from the conductivity type of the first contact region 402. In some embodiments, the absorption region 10 is intrinsic. In some embodiments, the absorption region 10 is of p-type germanium due to material defects formed during formation of the absorption region, where the defect density is from $1\times10^{14}$ cm$^{-3}$ to $1\times10^{16}$ cm$^{-3}$. In some embodiments, the term "intrinsic" means that the absorption region 10 is without intentionally adding dopants (e.g., material defects formed during formation resulting a p-type material). In some embodiments, the absorption region 10 is capable of absorbing the incident light and to generate photo-carriers.

In some embodiments, the absorption region 10 is of a conductivity type the same as the conductivity type of the first contact region 402 and includes a dopant and has a dopant profile with a peak dopant concentration lower than a peak dopant concentration of the first contact region 402. In some embodiments, the absorption region 10 includes germanium. In some embodiments, the photo-detecting device 400a further includes a charge region 406 in contact with the absorption region 10 and separated from the second contact region 404. In some embodiments, the charge region 406 fully/partially surrounds the absorption region 10 and is in the substrate 20. In some embodiments, a distance between the absorption region 10 and the charge region 406 is less than a distance between the charge region 406 and the second contact region 404. The distance is measured along a direction substantially parallel to the first surface 201 of the substrate 20. In some embodiments, a part of the charge region 406 is between the first contact region 402 and the second contact region 404 along a direction substantially parallel to the first surface 201 of the substrate 20.

Generally, the charge region 406 is formed to prevent a transport of photo-carriers from the absorption region 10 to the substrate 20 before a sufficient reverse bias (e.g., a threshold voltage) is applied to the second electrode 40. The charge region 406 is of a conductivity type the same as the conductivity type of the first contact region 402. In some embodiments, the charge region 406 includes a dopant and has a dopant profile with a peak dopant concentration higher than the peak dopant concentration of the absorption region 10. In some embodiments, the substrate is of a conductivity type different from the conductivity type of the second contact region 404. In some embodiments, the substrate 20 is of a conductivity type the same as the conductivity type of the second contact region 404. In some embodiments, the substrate 20 is intrinsic. In some embodiments, the substrate 20 includes Si. In some embodiments, a top surface of the charge region 406 is flush with a top surface of the second contact region 404.

In some embodiments, the material of the charge region 406 and the material of the second contact region 404 are the same. In some embodiments, the charge region 406 includes a dopant and has a dopant profile with a peak dopant concentration higher than the peak dopant concentration of the dopant of the substrate 20. In some embodiments, the charge region 406 includes a material different from the material of the absorption region 10.

In some embodiments, the photo-detecting device 400a further includes a first electrode 30 and a second electrode 40. The first electrode 30 is electrically coupled to the first contact region 402. The second electrode 40 is electrically coupled to the second contact region 404.

In some embodiments, the first contact region 402 includes p-Ge, the absorption region 10 includes i-Ge or p-Ge, the charge region 406 includes p-Si, the substrate includes i-Si or p-Si, and the second contact region 404 includes n-Si.

In some embodiments, a method for operating the photo-detecting device, includes applying a first voltage to a first electrode 30 electrically coupled to the first contact region 40; applying a second voltage to a second electrode 40 electrically coupled to the second contact region 404; generating, within the absorption region 10, one or more charge carriers from an incident light; providing, through the charge region 406, the one or more charge carriers from the absorption region 10 to a region between the charge region 406 and the second contact region 404; generating, within region, one or more additional charge carriers from the one or more charge carriers; and collecting a portion of the one or more additional charge carriers by the second contact region 404.

In some embodiments, a method for operating the photo-detecting device capable of collecting electrons, includes the steps of: applying a first voltage V1 to the first electrode 30 and applying a second voltage V2 to the second electrode 40 to generate a first current flowing from the second electrode 40 to the first electrode 30, where the second voltage V2 is higher than the first voltage V1; and receiving an incident light in the absorption region 10 to generate a second current flowing from the second electrode 40 to the first electrode 30 after the absorption region 10 generates photo-carriers from the incident light, where the second current is larger than the first current.

In some embodiments, when a voltage difference applied between the first electrode 30 and the second electrode 40 is larger than a threshold (e.g., a voltage difference not less than 6 Volts), the part of the substrate 20 between the charge region 406 and the second contact region 404 serves as a multiplication region M during the operation of the photo-detecting device 400a. In the multiplication region M, photo-carriers generate additional electrons and holes through impact ionization, which starts the chain reaction of avalanche multiplication. As a result, the photo-detecting device 400a has a gain. In some embodiments, the substrate 20 supports the absorption region 10 and is capable of amplifying the carriers by avalanche multiplication at the same time. In some embodiments, the second electrode 40 and the first electrode 30 are configured to be co-planarly on the substrate 20. As a result, a height difference between the second electrode 40 and the first electrode 30 is reduced. The multiplication function and the absorption function operate in the substrate 20 and the absorption region 10 respectively.

Figure 4B:
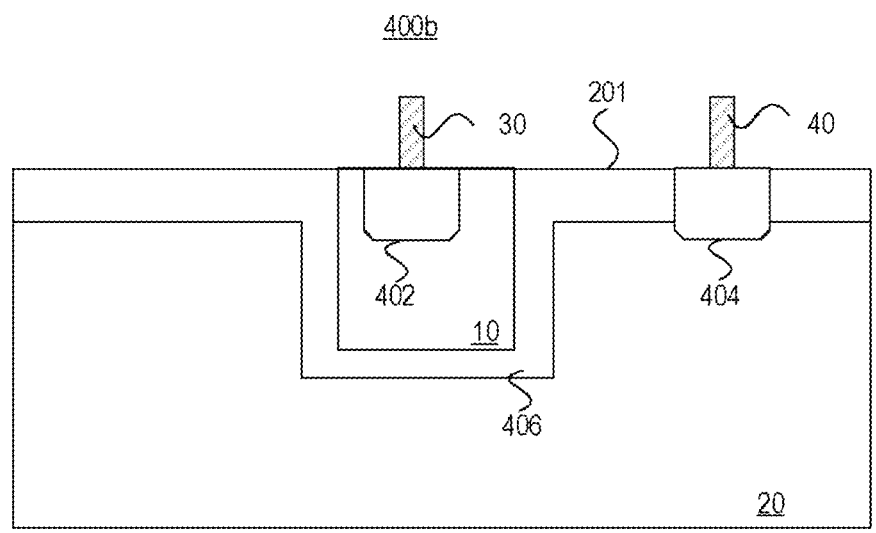

FIG. 4B illustrates a cross-sectional view of a photo-detecting device, according to some embodiments. The photo-detecting device 400b in FIG. 4B is similar to the photo-detecting device 400a in FIG. 4A. The difference is described below. The charge region 406 extends along a direction substantially parallel to the first surface 201 of the substrate 20, and the charge region 406 is partially overlapped with the second contact region 404.

In some embodiments, when a large voltage difference is applied between the first electrode 30 and the second electrode 40, for example, a voltage difference not less than 6 Volts, the part of the substrate 20 between the charge region 406 and the second contact region 404 serves as a multiplication region during the operation of the photo-detecting device. In the multiplication region, photo-carriers generate additional electrons and holes through impact ionization, which starts the chain reaction of avalanche multiplication. As a result, the photo-detecting device has a gain. In some embodiments, the substrate 20 supports the absorption region 10 and is capable of amplifying the carriers by avalanche multiplication at the same time. In some embodiments, the second electrode 40 and the first electrode 30 are configured co-planarly on the substrate 20. The multiplication function and the absorption function operate in the substrate 20 and the absorption region 10 respectively.

The operating method of the photo-detecting device 400b in FIG. 4B is similar to the operating method of the photo-detecting device 400a disclosed in FIG. 4A.

Figure 4C:
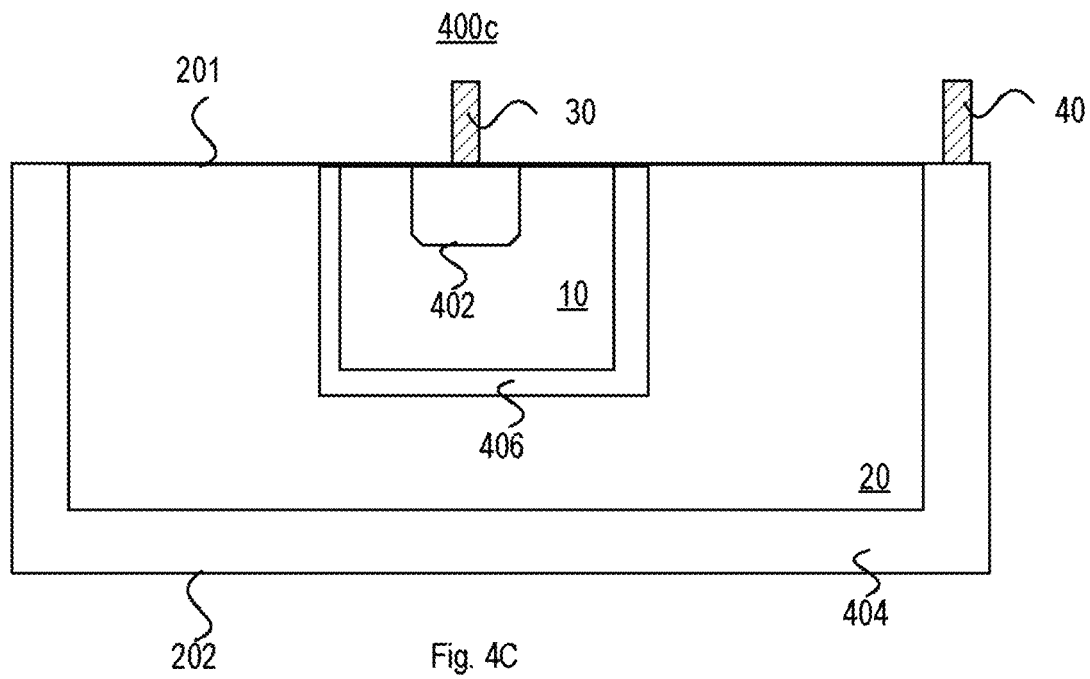

FIG. 4C illustrates a cross-sectional view of a photo-detecting device, according to some embodiments. The photo-detecting device 400c in FIG. 4C is similar to the photo-detecting device 400a in FIG. 4A. The difference is described below.

The second contact region 404 extends from a first surface 201 of the substrate 20 to a second surface 202 of the substrate 20. In some embodiments, the second contact region 404 surrounds the absorption region 10 and is physically separated from the absorption region 10. In some embodiments, a portion of the charge region 406 is between the first contact region 402 and a portion of the second contact region 404 along a direction substantially perpendicular to the first surface 201 of the substrate 20.

In some embodiments, the part of the substrate 20 between the charge region 406 and the second contact region 404, serves as a multiplication region during the operation of the photo-detecting device. In the multiplication region, photo-carriers generate additional electrons and holes through impact ionization, which starts the chain reaction of avalanche multiplication. As a result, the photo-detecting device has a gain. In some embodiments, the substrate 20 supports the absorption region 10 and is capable of amplifying the carriers by avalanche multiplication. In some embodiments, the second electrode 40 and the first electrode 30 are co-planarly on the substrate 20. The multiplication function and the absorption function operate in the substrate 20 and the absorption region 10 respectively.

The operating method of the photo-detecting device 400c in FIG. 4C is similar to the operating method of the photo-detecting device 400c disclosed in FIG. 4A.

The photo-detecting device in FIGS. 4A through 4C can be an avalanche photodiode. Referring to FIGS. 4A through 4C, in some embodiments. the current path between the first contact region 402 and the second contact region 404 may encounter the absorption region 10, and/or the charge region 406, and/or the substrate 20.

Figure 5A:
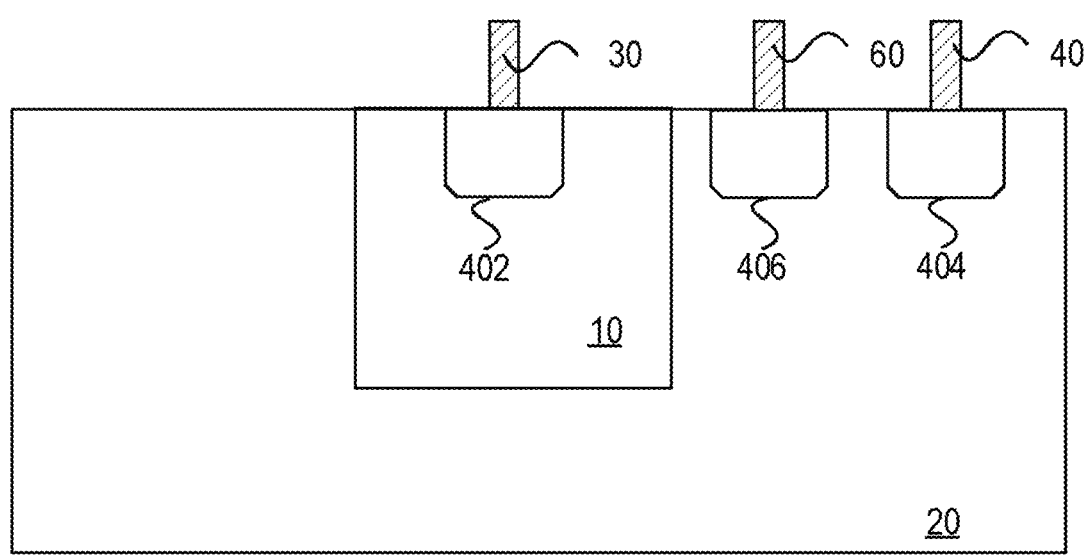
FIGS. 5A-5G illustrate cross-sectional views of a photo-detecting device, according to some embodiments.

FIG. 5A illustrates a cross-sectional view of a photo-detecting device, according to some embodiments. The photo-detecting device 500a in FIG. 5A is similar to the photo-detecting device 400a in FIG. 4A. The difference is described below.

The photo-detecting device 500a further includes a third electrode 60 electrically coupled to the charge region 406. In some embodiments, the charge region 406 is physically separated from the absorption region 10. The charge region 406 is of a conductivity type different from the conductivity type of the second contact region 404. In some embodiments, the charge region 406 is between the second contact region 404 and the first contact region 402. The third electrode 60 is between the first electrode 30 and the second electrode 40. In some embodiments, the material of the charge region 406 is the same as the material of the second contact region 404.

In some embodiments, the part of the substrate 20 between the charge region 406 and the second contact region 404, serves as a multiplication region during the operation of the photo-detecting device. In the multiplication region, photo-carriers generate additional electrons and holes through impact ionization, which starts the chain reaction of avalanche multiplication. As a result, the photo-detecting device has a gain. In some embodiments, the substrate 20 supports the absorption region 10 and is capable of amplifying the carriers by avalanche multiplication at the same time. In some embodiments, the second electrode 40, and the first electrode 30 and the third electrode 60 are co-planarly on the substrate 20. The multiplication function and the absorption function operate in the substrate 20 and the absorption region 10 respectively. In some embodiments, an operating method of the photo-detecting device 500a in FIG. 5A includes applying a first voltage to a first electrode 30 electrically coupled to the first contact region 40; applying a second voltage to a second electrode 40 electrically coupled to the second contact region 404 and applying a third voltage to a third electrode 60 electrically coupled to the charge region 406; generating, within the absorption region 10, one or more charge carriers from an incident light; providing, through the charge region 406, the one or more charge carriers from the absorption region 10 to a region between the charge region 406 and the second contact region 404; generating, within region, one or more additional charge carriers from the one or more charge carriers; and collecting In some embodiments, a method for operating the photo-detecting device 500a capable of collecting electrons in FIG. 5A, includes steps of:

applying a first voltage to the first electrode 30, applying a second voltage to a second electrode 40 and applying a third voltage to a third electrode 60 to generate a first total current; and receiving an incident light in the absorption region 10 to generate a second total current after the absorption region 10 generates photo-carriers from the incident light; where the second total current is larger than the first total current.

In some embodiments, the second voltage is greater than the first voltage, such that a forward-bias is created. In some embodiments, the third voltage is between the second voltage and the first voltage, such that a reverse-bias is created.

In some embodiments, the first total current includes a first current and a second current. if the photo-detecting device 500a in FIG. 5A is capable of collecting electrons, The first current flows from the second electrode 40 to the third electrode 60. The second current flows from the second electrode 40 to the first electrode 30.

In some embodiments, the second total current includes a third current and a fourth current. The third current flows from the second electrode 40 to the third electrode 60. The fourth current flows from the second electrode 40 to the first electrode 30.

In some embodiments, the third voltage can be selected to sweep the photo-carriers from the absorption region 10 to the multiplication region, that is, the part of the substrate between the charge region 406 and the second contact region 404. In some embodiments, the second voltage applied to the second electrode 40 can be selected to amplify the photo-carriers in the avalanche multiplication region, that is, the part of the substrate between the charge region 406 and the second contact region 404. In some embodiments, a voltage difference between the first voltage and third voltage is less than a voltage difference between the second voltage and the third voltage to facilitate the movement of photo-carriers from absorption region 10 to the avalanche multiplication region in the substrate 20 so as to reduce the noise of the photo-detecting device 500a. For example, when the first voltage applied to the first electrode 30 is 0 Volts, a third voltage applied to the third electrode 60 is 2V, and the second voltage applied to the second electrode 40 is 9V. In some implementations, a first bias voltage difference between the first electrode 30 and third electrode 60 is less than 4 Volts. The first bias voltage difference between the first electrode 30 and the third electrode 60 can be selected to be sufficient to sweep the generated one or more charge carriers from the absorption region 10 to the charge region 406 at a desired transit time. In one example, the first bias voltage difference between the first electrode 30 and the third electrode 60 can be between 0 and 4 Volts for the absorption region 10 that is composed of germanium.

In some implementations, a second bias voltage difference between the respective second electrode 40 and third electrode 60 is less than 20 Volts. The second bias voltage difference between the respective second electrode 40 and the third electrode 60 can be selected to be sufficient to sweep and amplify the generated one or more charge carriers from the charge region 406 to the multiplication region at a desired transit time and multiplication gain. In one example, the second bias voltage difference between the second electrode 40 and the third electrode 60 is between 6 and 20 Volts for the substrate 20 that is composed of silicon.

Figure 5B:
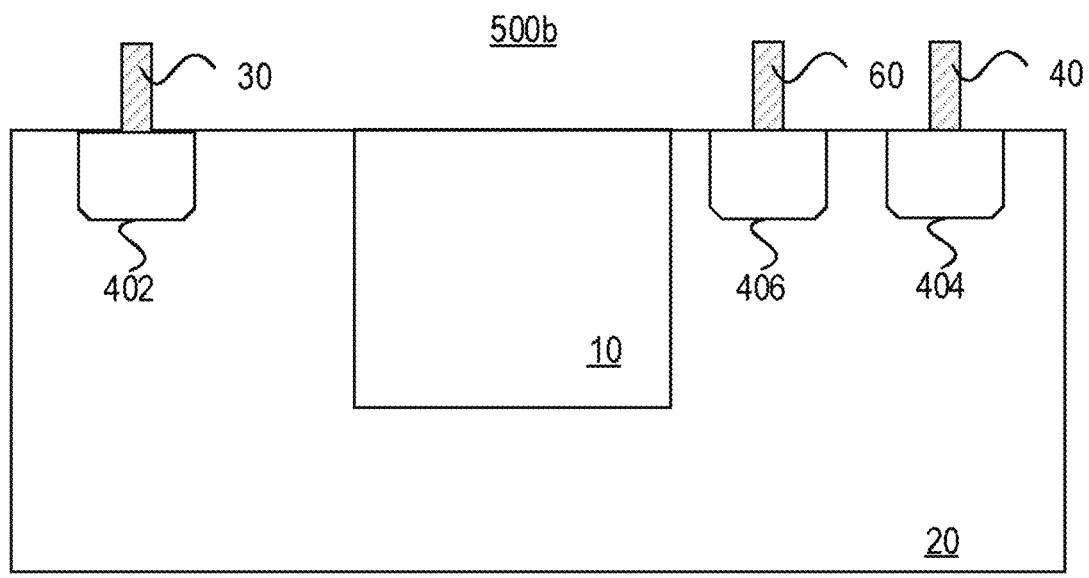

FIG. 5B illustrates a cross-sectional view of a photo-detecting device, according to some embodiments. The photo-detecting device 500b in FIG. 5B is similar to the photo-detecting device 500a in FIG. 5A. The difference is described below. The first contact region 402 is in the substrate 20. In other words, the first contact region 402 is outside of the absorption region 10. In some embodiments, the material of the first contact region 402, the material of the charge region 406, and the material of the second contact region 404 are the same.

The operating method of the photo-detecting device 500b in FIG. 5B is similar to the operating method of the photo-detecting device 500a disclosed in FIG. 5A.

Figure 5C:
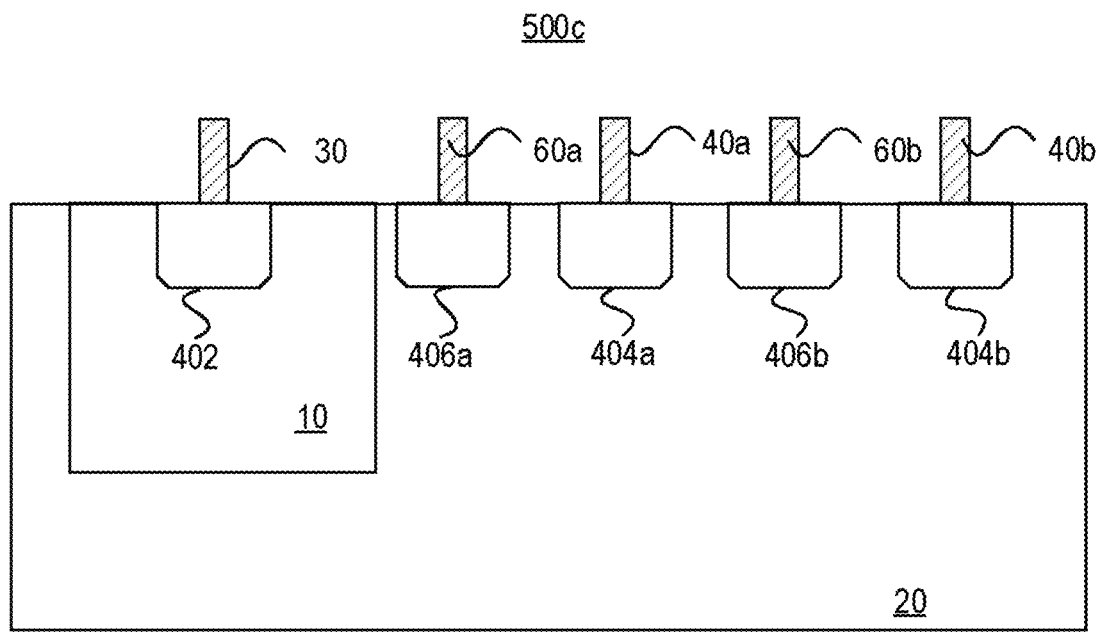

FIG. 5C illustrates a cross-sectional view of a photo-detecting device, according to some embodiments. The photo-detecting device 500c in FIG. 5C is similar to the photo-detecting device 500a in FIG. 5A. The difference is described below. The photo-detecting device includes multiple charge regions 406a, 406b, multiple second contact regions 404a, 404b, multiple second electrodes 40a, 40b and multiple third electrodes 60a, 60b. In some embodiments, one of the second contact regions 404a is between two successive charge regions 406a, 406b. In other words, the second contact regions 404a, 404b and the charge regions 406a, 406b are alternately disposed. In some embodiments, the substrate 20 includes multiple parts which function as multiplication regions. For example, a first part of the substrate 20 between the second contact region 404a and the charge region 406a functions as a multiplication region. A second part of the substrate 20 between the second contact region 404b and the charge region 406b functions as another multiplication region. As a result, the substrate 20 includes multiple multiplication regions. In some embodiments, some of the carriers not collected by the second electrode 40a will flow into the second part and encounter another avalanche multiplication. As a result, the gain of the photo-detecting device 500c can be further enhanced.

In some embodiments, the first electrode 30, multiple second electrodes 40a, 40b, and multiple third electrodes 60a, 60b are co-planarly on the substrate 20.

Figure 5D:
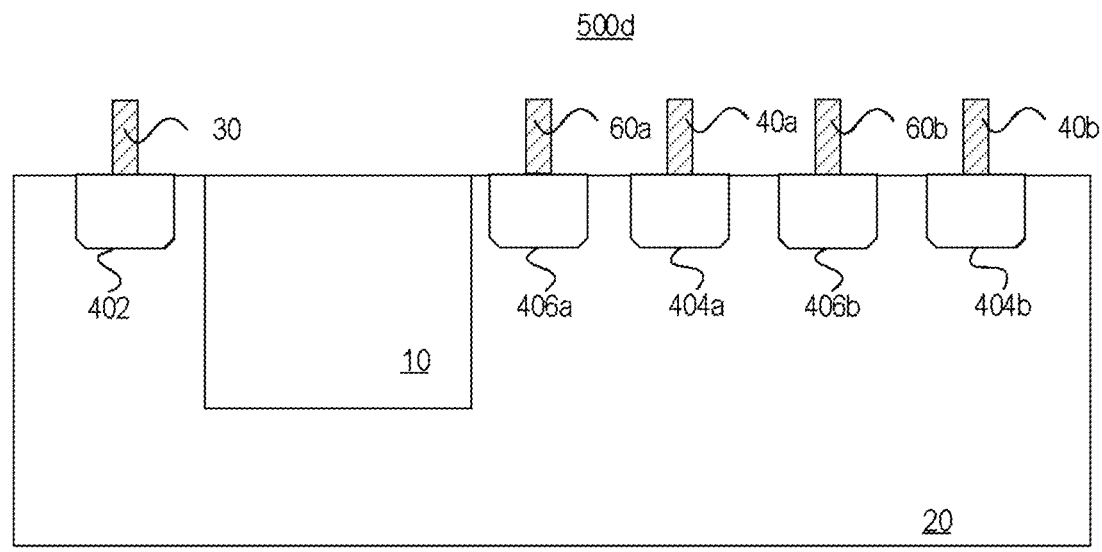

FIG. 5D illustrates a cross-sectional view of a photo-detecting device, according to some embodiments. The photo-detecting device 500d in FIG. 5D is similar to the photo-detecting device 500c in FIG. 5C. The difference is described below. The first contact region 402 is in the substrate 20. In other words, the first contact region 402 is outside of the absorption region 10. In some embodiments, the material of the first contact region 402, the material of the charge regions 106a, 106b, and the material of the second contact region 404a, 104b are the same.

The operating method of the photo-detecting device 500d in FIG. 5D is similar to the operating method of the photo-detecting device 500c disclosed in FIG. 5C.

Figure 5E:
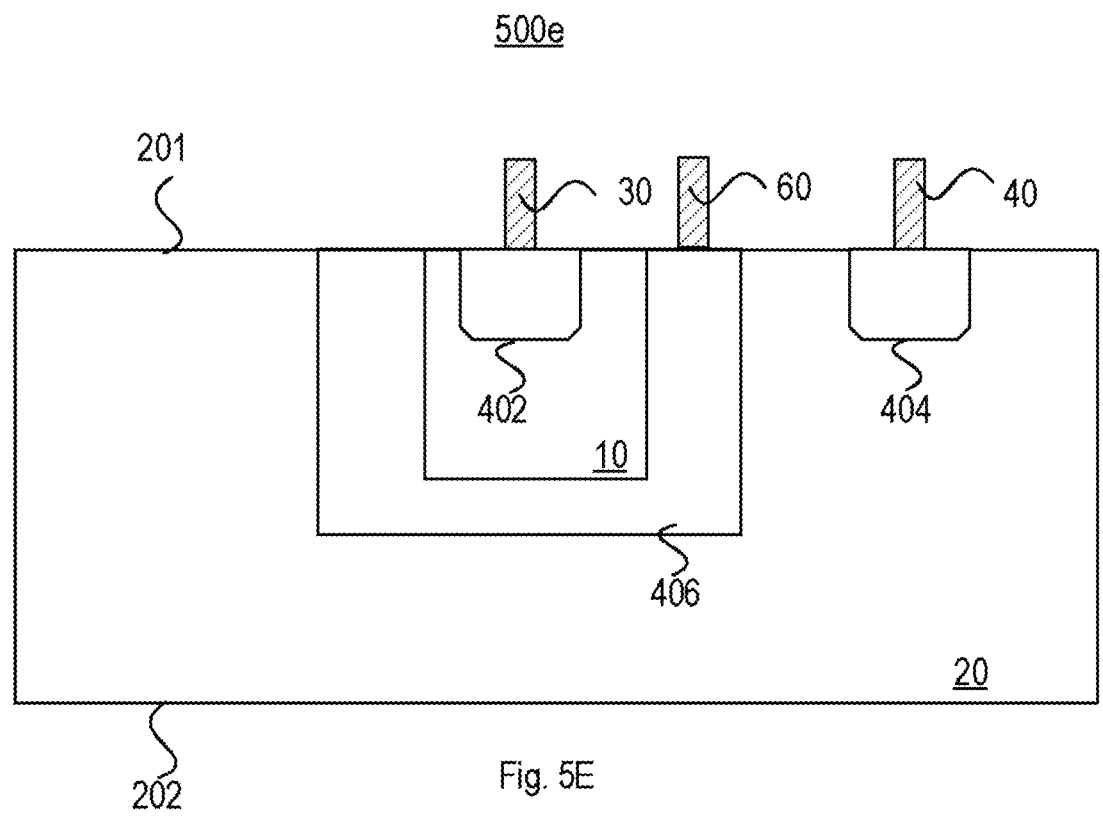

FIG. 5E illustrates a cross-sectional view of a photo-detecting device, according to some embodiments. The photo-detecting device 500e in FIG. 5E is similar to the photo-detecting device 400a in FIG. 4A. The difference is described below. The charge region 406 in photo-detecting device 500e is similar to the charge region 406 in photo-detecting device 400a, such as that the charge region 406 surrounds the absorption region 10. In additional, a third electrode 60 is in contact with the charge region 406 for biasing the charge region 406. The part of the substrate 20 between the charge region 406 and the second contact region 404 serves as a multiplication region during the operation of the photo-detecting device. In the multiplication region, photo-carriers generate additional electrons and holes through impact ionization, which starts the chain reaction of avalanche multiplication. As a result, the photo-detecting device 500e has a gain. In some embodiments, the substrate 20 supports the absorption region 10 and is capable of amplifying the carriers by avalanche multiplication at the same time.

The operating method of the photo-detecting device 500e in FIG. 5E is similar to the operating method of the photo-detecting device 500a disclosed in FIG. 5A.

Figure 5F:
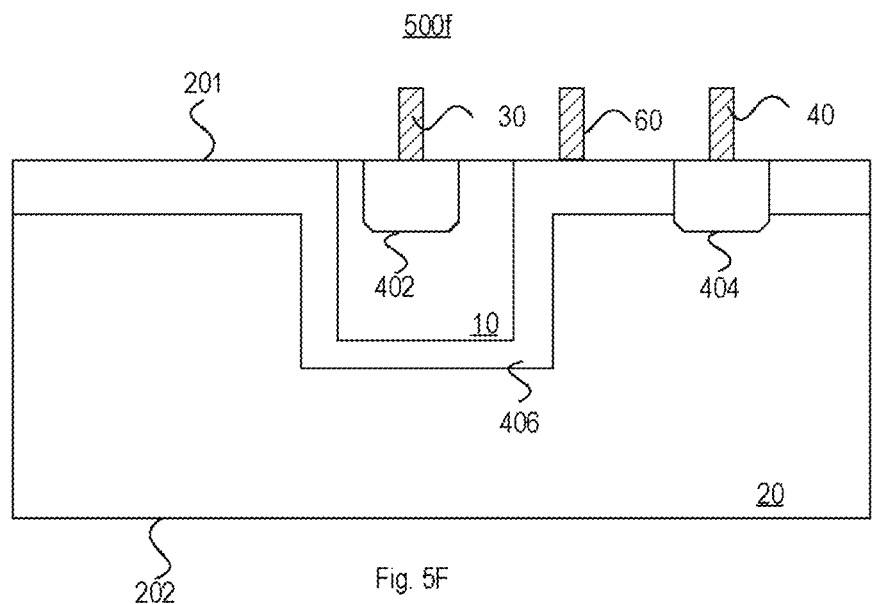

FIG. 5F illustrates a cross-sectional view of a photo-detecting device, according to some embodiments. The photo-detecting device 500f in FIG. 5F is similar to the photo-detecting device 400b in FIG. 4B. The difference is described below. The charge region 406 in photo-detecting device 500g is similar to the charge region 406 in photo-detecting device 400b, such as that the charge region 406 extends along a direction substantially parallel to the first surface 201 of the substrate 20, and the charge region 406 is partially overlapped with the second contact region 404. In addition, a third electrode 60 is in contact with the charge region 406. The part of the substrate 20 between the charge region 406 and the second contact region 404 serves as a multiplication region during the operation of the photo-detecting device. In the multiplication region, photo-carriers generate additional electrons and holes through impact ionization, which starts the chain reaction of avalanche multiplication. As a result, the photo-detecting device has a gain. In some embodiments, the substrate 20 supports the absorption region 10 and is capable of amplifying the carriers by avalanche multiplication at the same time. In some embodiments, the second electrode 40, and the first electrode 30 and the third electrode 60 are co-planarly on the substrate 20.

The operating method of the photo-detecting device 500f in FIG. 5F is similar to the operating method of the photo-detecting device 500a disclosed in FIG. 5A.

Figure 5G:
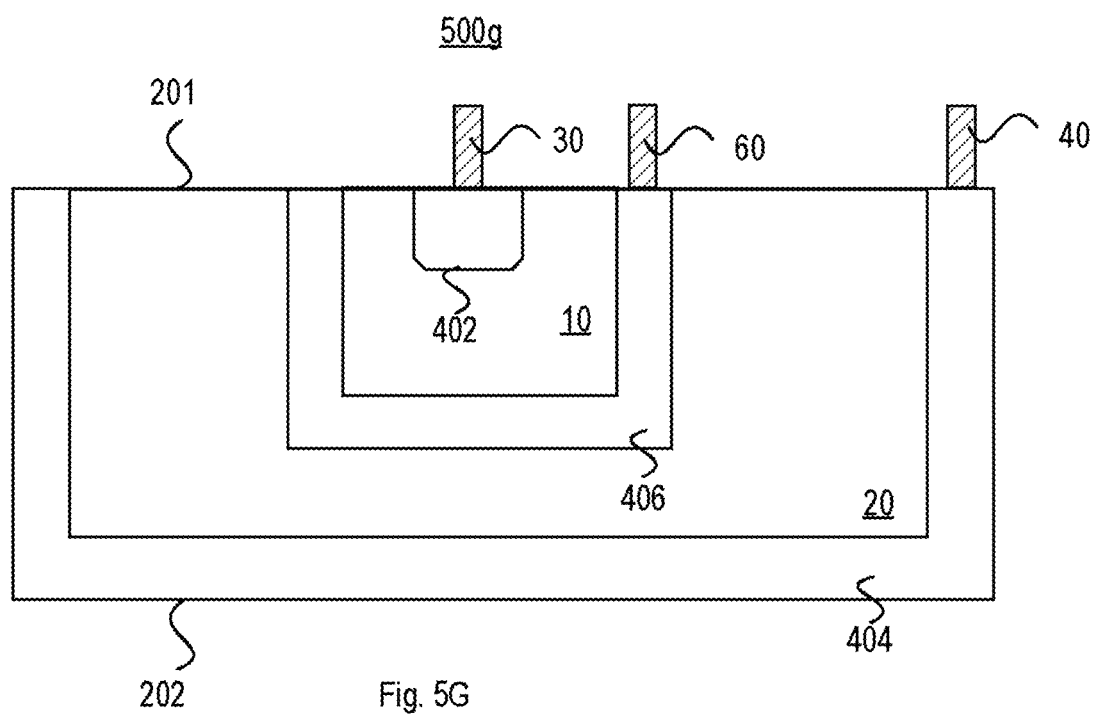

FIG. 5G illustrates a cross-sectional view of a photo-detecting device, according to some embodiments. The photo-detecting device 500g in FIG. 5G is similar to the photo-detecting device 400c in FIG. 4C. The difference is described below. The charge region 406 in photo-detecting device 500e is similar to the charge region 406 in photo-detecting device 400a, such as that the charge region 406 surrounds the absorption region 10. In addition, a third electrode 60 is in contact with the charge region 406. In some embodiments, the second contact region 404 extends from a first surface 201 of the substrate 20 to a second surface 202 of the substrate 20. In some embodiments, the second contact region 404 surrounds the absorption region 10 and is physically separated from the absorption region 10. In some embodiments, a portion of the charge region 406 is between the first contact region 402 and a portion of the second contact region 404 along a direction substantially perpendicular to the first surface 201 of the substrate 20. The part of the substrate 20 between the charge region 406 and the second contact region 404, serves as a multiplication region during the operation of the photo-detecting device. In the multiplication region, photo-carriers generate additional electrons and holes through impact ionization, which starts the chain reaction of avalanche multiplication. As a result, the photo-detecting device has a gain. In some embodiments, the substrate 20 supports the absorption region 10 and is capable of amplifying the carriers by avalanche multiplication. In some embodiments, the second electrode 40, the first electrode 30, and the third electrode 60 are co-planarly on the substrate 20.

The operating method of the photo-detecting device 500g in FIG. 5G is similar to the operating method of the photo-detecting device 500a disclosed in FIG. 5A.

The photo-detecting device in FIGS. 5A through 5G can be an avalanche photodiode.

Referring to FIG. 5A through 5G, in some embodiments, the current path between the first contact region 402 and the second contact region 404 may encounter the absorption region 10, and/or the charge region 406, and/or the substrate 20.

Referring to FIGS. 4A through 4C and FIGS. 5A through 5G, in some embodiments, the conductivity type of the regions can be opposite in the previous embodiments when collecting holes. Taking the photo-detecting device 400a in FIG. 4A as an example, in some embodiments, the conductivity type of the first contact region 402 is n-type. The conductivity type of the second contact region 404 is p-type. The photo-detecting device 400a is capable of collecting holes, which are further processed by such as circuitry. A method for operating the photo-detecting device capable of collecting holes, includes the steps of: applying a first voltage V1 to the first electrode 30 and applying a second voltage V2 to the second electrode 40 to generate a first current flowing from the first electrode 30 to the second electrode 40, where the second voltage V2 is lower than the first voltage V1; and receiving an incident light in the absorption region 10 to generate a second current flowing from the first electrode 30 to the second electrode 40 after the absorption region 10 generates photo-carriers from the incident light, where the second current is larger than the first current. Since the second current is larger than the first current, the photo-detecting device is with improved signal to noise ratio.

Taking the photo-detecting device 500a in FIG. 5A as another example, in some embodiments, the conductivity type of the first contact region 402 is n-type. The conductivity type of the second contact region 404a is p-type. The conductivity type of the charge region 406 is n-type. The method for operating the photo-detecting device capable of collecting holes, includes: applying a first voltage to the first electrode 30, applying a second voltage to a second electrode 40, and applying a third voltage to a third electrode 60 to generate a first total current; receiving an incident light in the absorption region 10 to generate a second total current after the absorption region 10 generates photo-carriers from the incident light; and where the second total current is larger than the first total current; where the second voltage is lower than the first voltage. In some embodiments, the third voltage is between the second voltage and the first voltage.

Figure 6A:
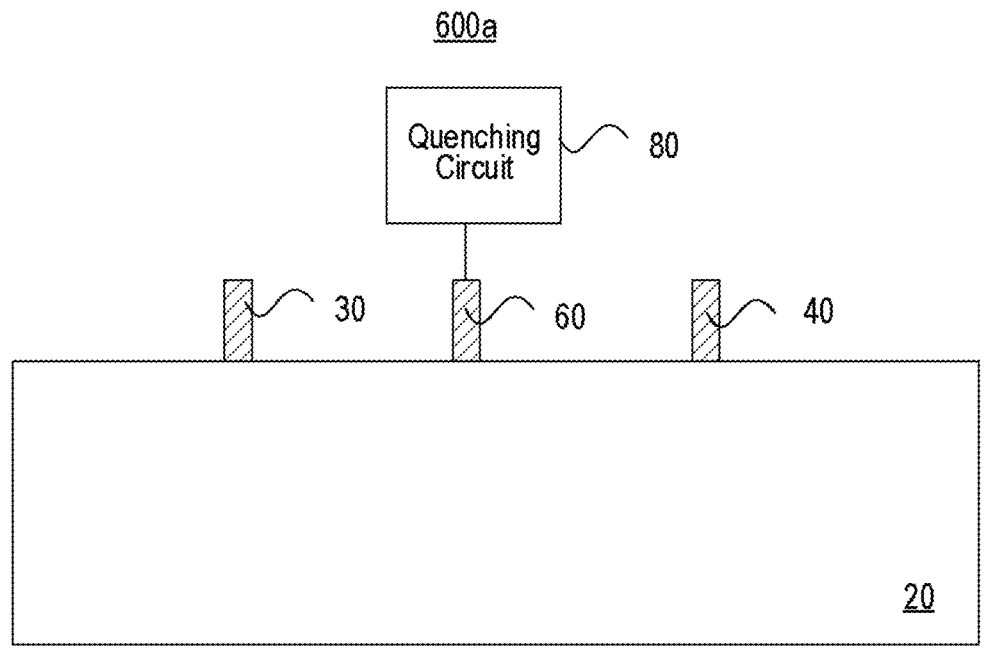
FIGS. 6A-6B illustrate cross-sectional views of a photo-current amplification apparatus, according to some embodiments.
Figure 6B:
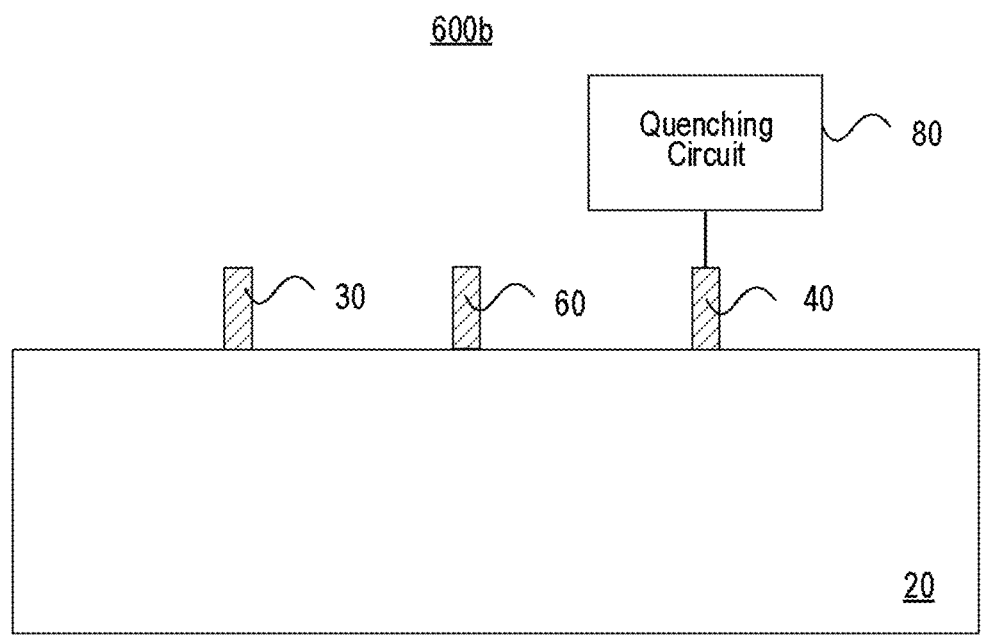

FIG. 6A illustrates a cross-sectional view of a photo-current amplification apparatus, according to some embodiments. FIG. 6B illustrates a cross-sectional view of a photo-current amplification apparatus, according to some embodiments. The photo-current amplification apparatus 600a, 600b can include a photo-detecting device substantially the same as any embodiments in FIGS. 5A through 5G. The photo-current amplification apparatus 600a further includes a quenching circuit 80 electrically coupled to the third electrode 60 of the photo-detecting device.

In some embodiments, the quenching circuit 80 may be fabricated on another substrate and integrated/co-packaged with the photo-detecting device via die/wafer bonding or stacking. In some embodiments, the photo-current amplification apparatus 600a, 600b include a bonding layer (not shown) between the quenching circuit 80 and the photo-detecting device. The bonding layer may include any suitable material such as oxide or semiconductor or metal or alloy. The photo-current amplification apparatus 600b further includes a quenching circuit 80 electrically coupled to the second electrode 40. The quenching circuit 80 controls the gain of the photo-detecting device for a desired period of time, such as but not limited to eliminating the gain after picosecond-to-millisecond duration, when the avalanche multiplication is operated in the Geiger-mode rather than linear-mode.

In some embodiments, the quenching circuit 80 includes a passive element. In some embodiments, the passive element includes, but is not limited to a resistor.

In some embodiments, the quenching circuit includes an active element. In some embodiments, the active element includes, but is not limited to a transistor.

Figure 7A:
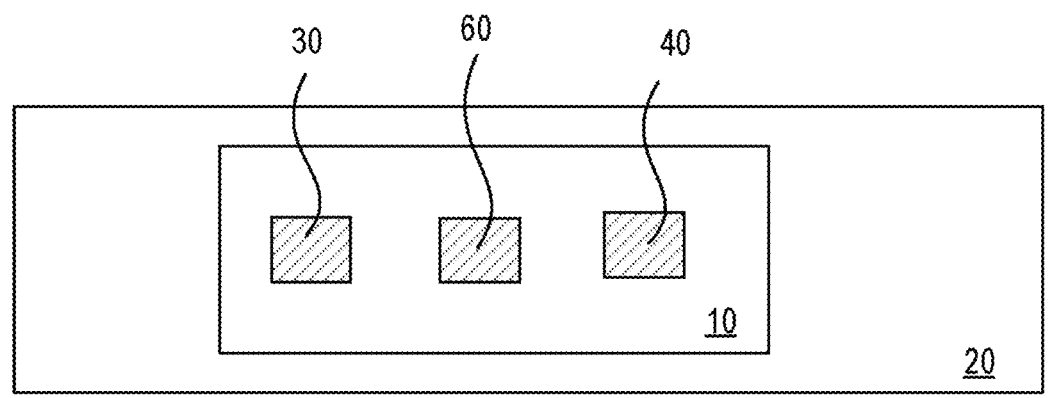
FIGS. 7A-7C illustrate top views of a photo-detecting device, according to some embodiments.
Figure 7B:
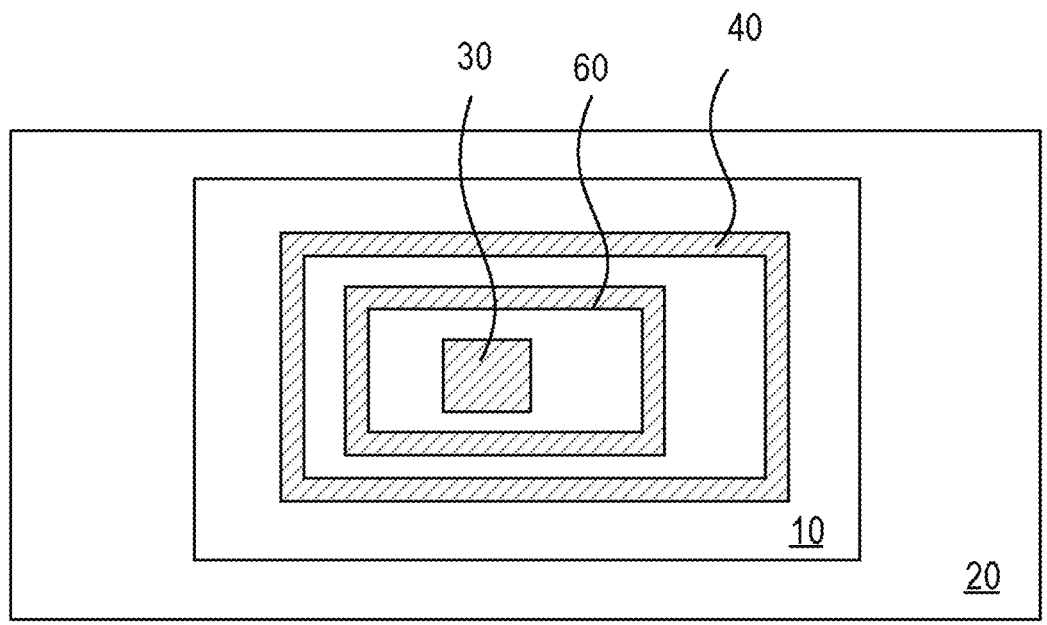
Figure 7C:
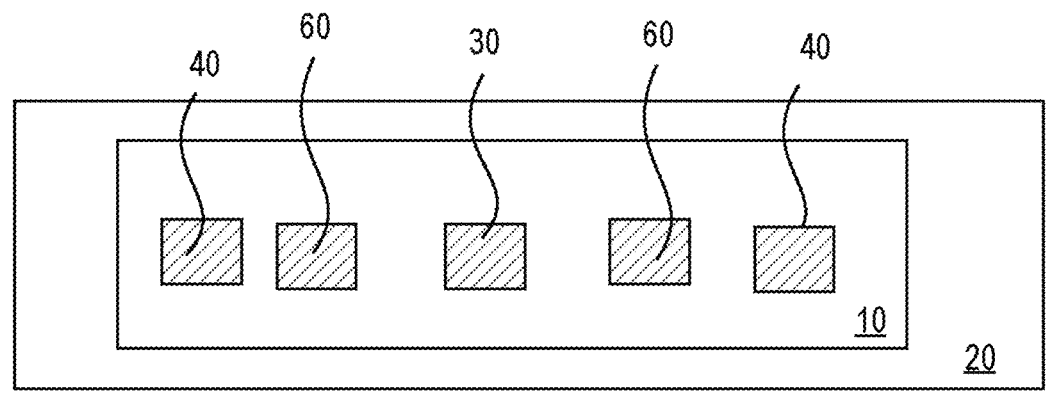

FIGS. 7A-7C illustrate top view of a photo-detecting device, according to some embodiments. The photo-detecting device 700a, 700b and 700c can include a structure substantially the same as any embodiments in FIGS. 2A through 2O and FIGS. 5A through 5G. Referring to FIGS. 7A-7C, the third electrode 60, the second electrode 40 and the first electrode 30 can be arranged in any suitable arrangement or having different shapes from a top view of the photo-detecting device. For example, referring to FIG. 7A, the third electrode 60 is between the first electrode 30 and the second electrode 40. Referring to FIG. 7B, the shape of the third electrode 60, the shape of the second electrode 40 and the shape of first electrode 30 are square ring. However, the shape is not limited to square ring. The third electrode 60, the second electrode 40 and the first electrode 30 include any suitable shapes, such as annular ring. Referring to FIG. 7C, the arrangement of the third electrode 60 and the second electrode 40 can be made symmetrical with respect to the first electrode 30 such that the first electrode 30 is between the two third electrode 60 and the two second electrode 40.

Similarly, the second electrode 40 and the first electrode 30 can be arranged in any suitable arrangement or having different shapes from a top view of the photo-detecting device in any embodiments in FIGS. 1A through 1J and FIGS. 4A through 4C. The different arrangement is within the scope of the present disclosure as long as the person having ordinary skill in the technical field can produce.

In some embodiments, the position of the emitter contact region 102 (along with the first electrode 30) and the position of the base contact region 106 (along with the third electrode 60) can be interchanged in FIG. 2A-2O.

Figure 8A:
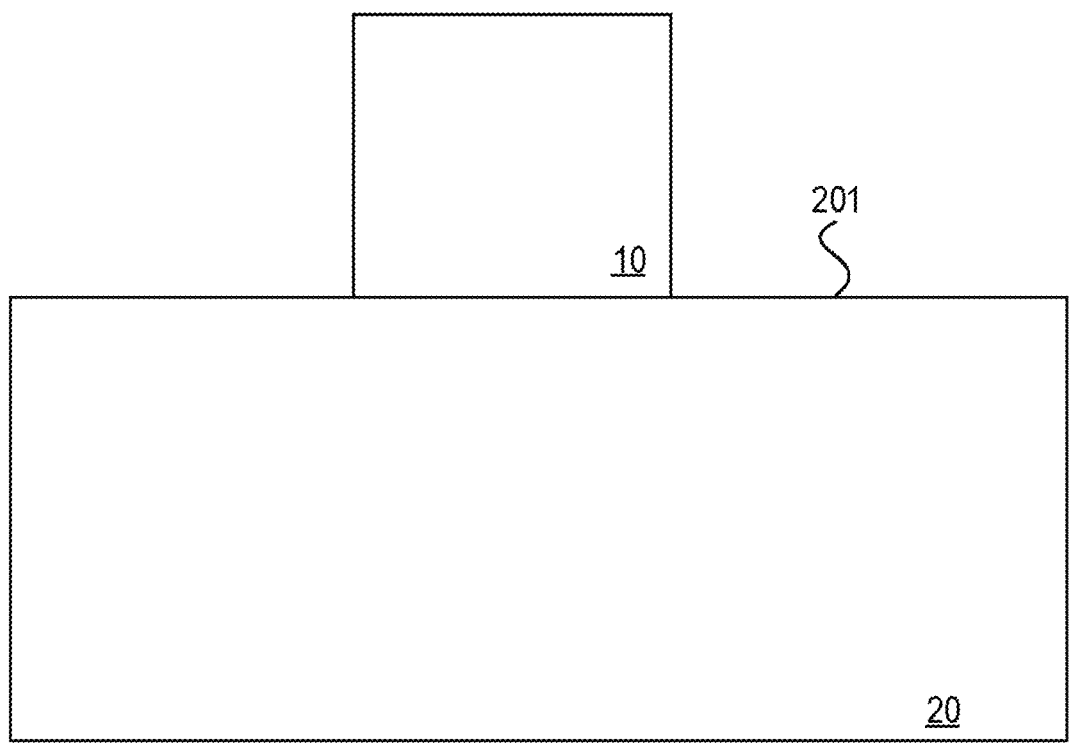
FIGS. 8A-8D illustrate cross-sectional views of a portion of a photo-detecting device, according to some embodiments.
Figure 8B:
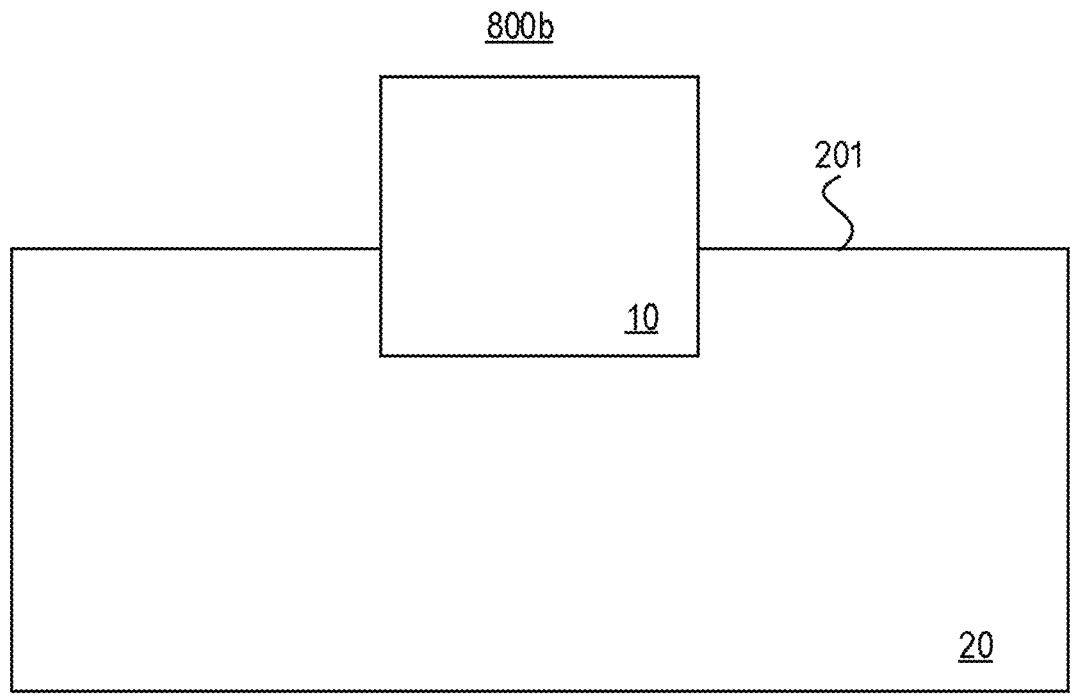
Figure 8C:
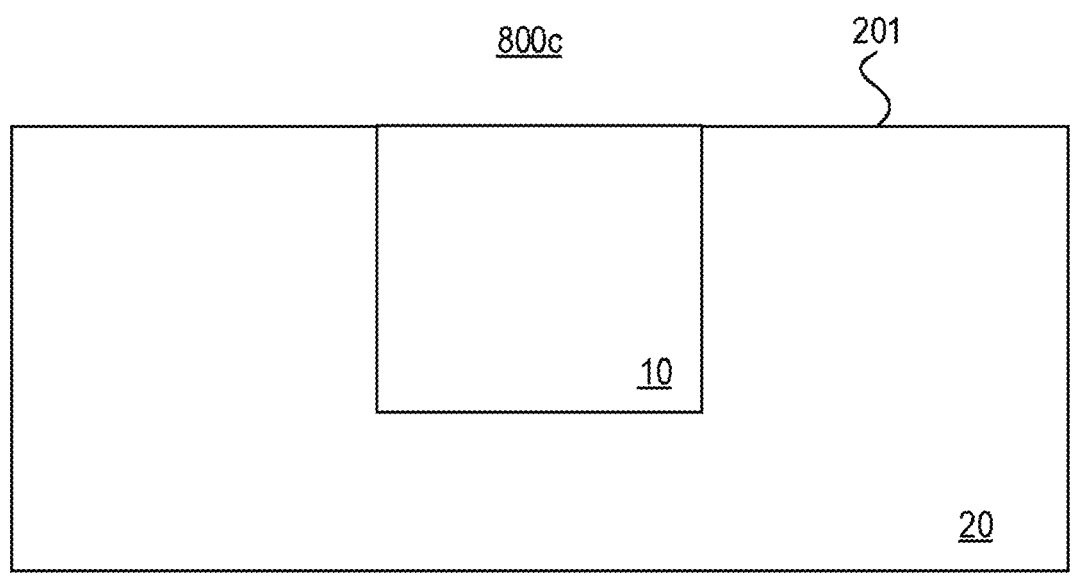

FIGS. 8A-8C illustrate cross-sectional views of a portion of a photo-detecting device, according to some embodiments. The photo-detecting device 800a, 800b, 800c can include a structure substantially the same as any embodiments in FIGS. 1A through 1J, FIGS. 2A through 2O, FIGS. 3A through 3D, FIGS. 4A through 4C, FIGS. 5A through 5G and FIGS. 6A and 6B. Referring to FIGS. 8A through 8C, in some embodiments, if not specifically mentioned in the previous embodiment, the absorption region 10 can be entirely on the first surface 201 of the substrate 20, partially embedded in the substrate 20 or entirely embedded in the substrate 20.

Figure 8D:
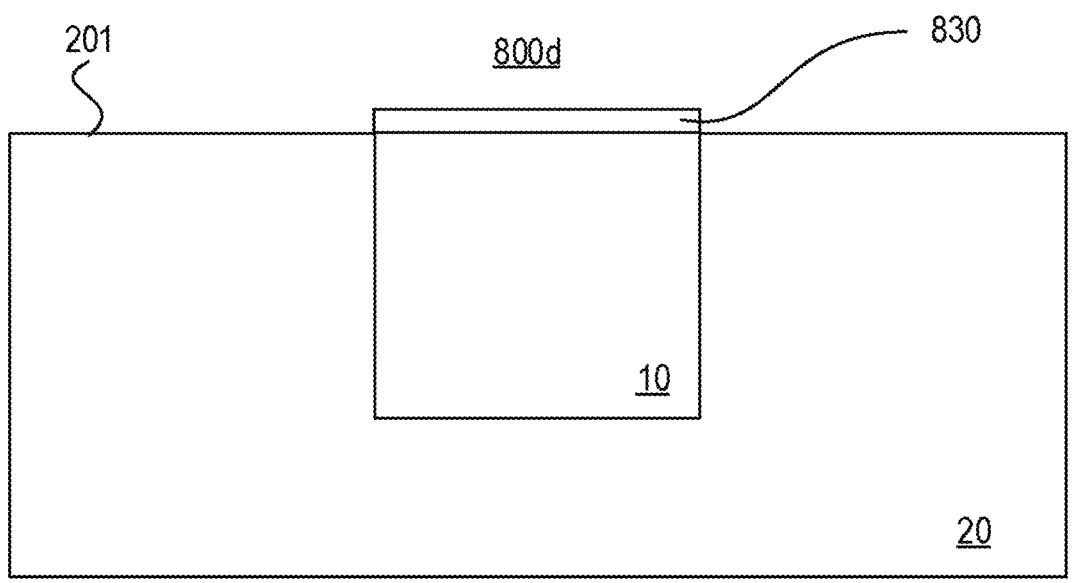

FIG. 8D illustrate cross-sectional views of a portion of a photo-detecting device, according to some embodiments. The photo-detecting device 800d can include a structure substantially the same as any embodiments in FIGS. 1A through 1J, FIGS. 2A through 2O, FIGS. 3A through 3D, FIGS. 4A through 4C, FIGS. 5A through 5G and FIGS. 6A and 6B. Referring to FIG. 8D, in some embodiments, the photo-detecting device 800d further includes an interface layer 830 covering a first surface of the absorption region 10 and/or covers a portion of the first surface 201 of the substrate 20. In some embodiments, the interface layer 830 further covers a sidewall of the absorption region 10 exposed from the substrate 20. The interface layer 830 may include amorphous silicon, poly silicon, epitaxial silicon, aluminum oxide (e.g., AlxOy), silicon oxide (e.g., SixOy), Ge oxide (e.g., GexOy), germanium-silicon (e.g., GeSi), silicon nitride family (e.g., SixNy), high-k materials (e.g. HfOx, ZnOx, LaOx, LaSiOx), and any combination thereof. The presence of the interface layer 830 may have various effects. For example, the interface layer 830 may act as a surface passivation layer to the absorption region 10, which may reduce dark current or leakage current generated by defects occurred at the exposed surface of the absorption region 10. In some embodiments, the collector contact region, the emitter contact region, the base region, the first region or the second region disclosed in the present disclosure may be extended into the interface layer 830 if the collector contact region and/or the emitter contact region and/or the base region, and/or the first region and/or the second region is formed in the absorption region 10. In some embodiments, the first electrode 30, the second electrode 40 and the third electrode 60 may be over the interface layer 830.

In the present disclosure, if not specifically mention, the substrate 20 is made by a first material or a first material-composite. The absorption region is made by a second material or a second material-composite. The second material or a second material-composite is different from the first material or a first material-composite. For example, in some embodiments, the combinations of elements of second material or a second material-composite is different from the combinations of elements in the first material or a first material-composite.

In some embodiments, the absorption region 10 includes a semiconductor material. In some embodiments, the absorption region 10 includes polycrystalline material. In some embodiments, the substrate 20 includes a semiconductor material. In some embodiments, the absorption region 10 includes a Group III-V semiconductor material. In some embodiments, the substrate 20 includes a Group III-V semiconductor material. The Group III-V semiconductor material may include, but is not limited to, GaAs/AlAs, InP/InGaAs, GaSb/InAs, or InSb. In some embodiments, the absorption region 10 includes a semiconductor material including a Group IV element. For example, Ge, Si or Sn. In some embodiments, the absorption region 10 includes GexSi1-x, where 0<x<1. In some embodiments, the absorption region 10 includes the SixGeySn1-x-y, where 0≤x≤1, 0≤y≤1. In some embodiments, the absorption region 10 includes the Ge1-aSna, where 0≤a≤0.1. In some embodiments, the substrate 20 includes Si. In some embodiments, the substrate 20 is composed of Si. In some embodiments, the absorption region 10 is composed of germanium. In some embodiments, the absorption region 10 composed of intrinsic germanium is of p-type due to material defects formed during formation of the absorption region 10, where the defect density is from $1\times10^{14}$ cm$^{-3}$ to $1\times10^{16}$ cm$^{-3}$.

In the present disclosure, if not specifically mention, the absorption region 10 has a thickness depending on the wavelength of photons to be detected and the material of the absorption region 10. In some embodiments, when the absorption region 10 includes germanium and is designed to absorb photons having a wavelength not less than 800 nm, the absorption region 10 has a thickness not less than 0.1 um. In some embodiments, the absorption region 10 includes germanium and is designed to absorb photons having a wavelength between 800 nm and 2000 nm, the absorption region 10 has a thickness between 0.1 um and 2.5 um. In some embodiments, the absorption region 10 has a thickness between 1 um and 2.5 um for higher quantum efficiency. In some embodiments, the absorption region 10 may be grown using a blanket epitaxy, a selective epitaxy, or other applicable techniques.

In the present disclosure, if not specifically mention, the first electrode 30, the second electrode 40 and the third electrode 60 include metals or alloys. For example, the first electrode, the second electrode and the third electrode include Al, Cu, W, Ti, Ta—TaN —Cu stack or Ti—TiN—W stack.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A photo-current amplification apparatus, comprising:
   a photo-detecting device, comprising:
   a substrate comprising silicon;
   an absorption region comprising germanium, the absorption region supported by the substrate, wherein the absorption region comprises a p-doped absorption region configured to receive an optical signal and to generate a first electrical signal based on the optical signal;
   an emitter contact region formed in the absorption region;
   a collector contact region outside of the absorption region, wherein the collector contact region is n-doped; and
   a base region formed in the absorption region, wherein the base region is p-doped having a peak doping concentration higher than that of the p-doped absorption region,
   wherein a second electrical signal collected by the collector contact region is greater than the first electrical signal generated by the absorption region.

2. The photo-current amplification apparatus of claim 1, wherein the base region is formed in the absorption region, and wherein a doping concentration of a dopant of the base region is between $1\times10^{16}$ cm$^{-3}$ to $1\times10^{19}$ cm$^{-3}$.

3. The photo-current amplification apparatus of claim 1, wherein the photo-detecting device further comprises a first electrode electrically coupled to the emitter contact region, and wherein the photo-detecting device further comprises a second electrode electrically coupled to the collector contact region.

4. The photo-current amplification apparatus of claim 1, further comprising a sustaining circuit electrically coupled to the photo-detecting device, wherein the sustaining circuit is configured to control a gain of the photo-detecting device.

5. The photo-current amplification apparatus of claim 4, wherein the sustaining circuit includes a passive element including an inductor or a resistor.

6. The photo-current amplification apparatus of claim 4, wherein the sustaining circuit includes an active element including a switch or a transistor.

7. The photo-current amplification apparatus of claim 4, further including a bonding layer that bonds the sustaining circuit and the photo-detecting device.

8. The photo-current amplification apparatus of claim 1, wherein the substrate further comprises a p-doped region formed between the collector contact region and the base region.

9. The photo-current amplification apparatus of claim 1, wherein the substrate further comprises an intrinsic region formed between the collector contact region and the base region.

10. The photo-current amplification apparatus of claim 1, wherein the base region at least partially surrounds the emitter contact region.

11. The photo-current amplification apparatus of claim 1, wherein the collector contact region at least partially surrounds the base region.

12. The photo-current amplification apparatus of claim 1, wherein the emitter contact region is n-doped.

* * * * *